US011961491B2

(12) United States Patent
Anzai et al.

(10) Patent No.: US 11,961,491 B2
(45) Date of Patent: **\*Apr. 16, 2024**

(54) ELECTRO-OPTICAL DEVICE

(71) Applicant: Japan Display Inc., Tokyo (JP)

(72) Inventors: Katsuya Anzai, Anpachi-cho (JP);
Hideki Kawada, Anpachi-cho (JP);
Hiroshi Matsuda, Gifu (JP); Yukitada Iwasaki, Mizuho (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/204,482

(22) Filed: Jun. 1, 2023

(65) Prior Publication Data

US 2023/0306925 A1    Sep. 28, 2023

Related U.S. Application Data

(63) Continuation of application No. 17/876,951, filed on Jul. 29, 2022, now Pat. No. 11,699,411, which is a
(Continued)

(30) Foreign Application Priority Data

Oct. 23, 2007    (JP) ................................ 2007-274733
Nov. 9, 2007     (JP) ................................ 2007-291596
(Continued)

(51) Int. Cl.
*G09G 3/36*    (2006.01)
*G09G 3/20*    (2006.01)
(Continued)

(52) U.S. Cl.
CPC ......... *G09G 3/3677* (2013.01); *G09G 3/2096* (2013.01); *G09G 3/3225* (2013.01);
(Continued)

(58) Field of Classification Search
CPC .. G09G 3/2096; G09G 3/3275; G09G 3/3266; G09G 3/3225; G09G 3/36–3696;
(Continued)

(56) References Cited

U.S. PATENT DOCUMENTS 5,270,693 A    12/1993    Wyler
5,627,665 A    5/1997    Yamada
(Continued)

FOREIGN PATENT DOCUMENTS

JP    06258625       9/1994
JP    2004-177433    6/2004
(Continued)

OTHER PUBLICATIONS

Japanese Patent Office, Notification of reasons for refusal issued in connection with Japanese Patent Application No. 2008-164114, dated Sep. 4, 2012. (5 pages).

*Primary Examiner* — David Tung
(74) *Attorney, Agent, or Firm* — K&L Gates LLP

(57) ABSTRACT

An electro-optical device is provided and includes a plurality of first signal lines extending in a first direction on a substrate; a plurality of second signal lines extending in a second direction on the substrate, the second direction intersecting the first direction; a pixel area in which a plurality of pixel electrodes are disposed; an outer peripheral edge of the pixel area having a curved portion or a bent portion; and a first circuit block, a second circuit block, and a third circuit block arranged along the outer peripheral edge, wherein the second circuit block is arranged between the first circuit block and the first circuit block, and a first gap between the first circuit bock and the second circuit block is different from a second gap between the second circuit block and the third circuit block.

20 Claims, 15 Drawing Sheets

Related U.S. Application Data continuation of application No. 17/371,846, filed on Jul. 9, 2021, now Pat. No. 11,404,017, which is a continuation of application No. 16/906,807, filed on Jun. 19, 2020, now Pat. No. 11,062,668, which is a continuation of application No. 15/453,484, filed on Mar. 8, 2017, now Pat. No. 10,692,453, which is a continuation of application No. 12/211,425, filed on Sep. 16, 2008, now Pat. No. 9,626,900.

(30) Foreign Application Priority Data

| | | |
|---|---|---|
| Jun. 24, 2008 | (JP) | 2008-164114 |
| Jun. 24, 2008 | (JP) | 2008-164115 |

(51) Int. Cl.

| | |
|---|---|
| *G09G 3/3225* | (2016.01) |
| *G09G 3/3266* | (2016.01) |
| *G09G 3/3275* | (2016.01) |
| *H10K 59/131* | (2023.01) |

(52) U.S. Cl.
CPC ......... *G09G 3/3266* (2013.01); *G09G 3/3275* (2013.01); *G09G 3/3648* (2013.01); *G09G 3/3688* (2013.01); *G09G 2300/0408* (2013.01); *G09G 2300/0426* (2013.01); *G09G 2300/0465* (2013.01); *G09G 2310/0232* (2013.01); *H10K 59/131* (2023.02)

(58) Field of Classification Search
CPC ... G09G 2300/0426; G09G 2300/0465; G09G 2300/0408; G09G 2310/0232; G02F 1/133; H10K 59/131; H01L 27/3276
See application file for complete search history.

(56) References Cited

U.S. PATENT DOCUMENTS

| | | | |
|---|---|---|---|
| 5,949,397 | A | 9/1999 | Koyama et al. |
| 8,169,570 | B2 | 5/2012 | Morita |
| 8,248,559 | B2 | 8/2012 | Morita |
| 9,312,284 | B2 | 4/2016 | Wu |
| 9,626,900 | B2 | 4/2017 | Anzai et al. |
| 2004/0066361 | A1* | 4/2004 | Ishii ............... G09G 3/3688 345/87 |
| 2005/0200591 | A1* | 9/2005 | Satoh ............ G09G 3/3677 345/103 |
| 2005/0225690 | A1 | 10/2005 | Battersby |
| 2006/0077191 | A1 | 4/2006 | Ming-Daw et al. |
| 2007/0109484 | A1* | 5/2007 | Murahashi ......... G02F 1/13452 349/149 |
| 2008/0018557 | A1 | 1/2008 | Maeda |
| 2008/0018583 | A1* | 1/2008 | Knapp ............. G02F 1/134309 345/87 |
| 2008/0048934 | A1* | 2/2008 | Yamamoto ........ G09G 3/3611 345/55 |
| 2008/0088568 | A1 | 4/2008 | Haga et al. |
| 2009/0189835 | A1 | 7/2009 | Kim |
| 2010/0013853 | A1 | 1/2010 | Takatori |
| 2012/0112988 | A1 | 5/2012 | Nakanishi |
| 2014/0253419 | A1 | 9/2014 | Tanada |

FOREIGN PATENT DOCUMENTS

| | | |
|---|---|---|
| JP | 2005-528644 | 9/2005 |
| JP | 2006-91894 | 4/2006 |
| JP | 2006276361 | 10/2006 |
| JP | 2007091559 | 4/2007 |
| JP | 2008-501138 | 1/2008 |
| JP | 2008-065198 | 3/2008 |
| WO | 2009/054166 | 4/2009 |

* cited by examiner

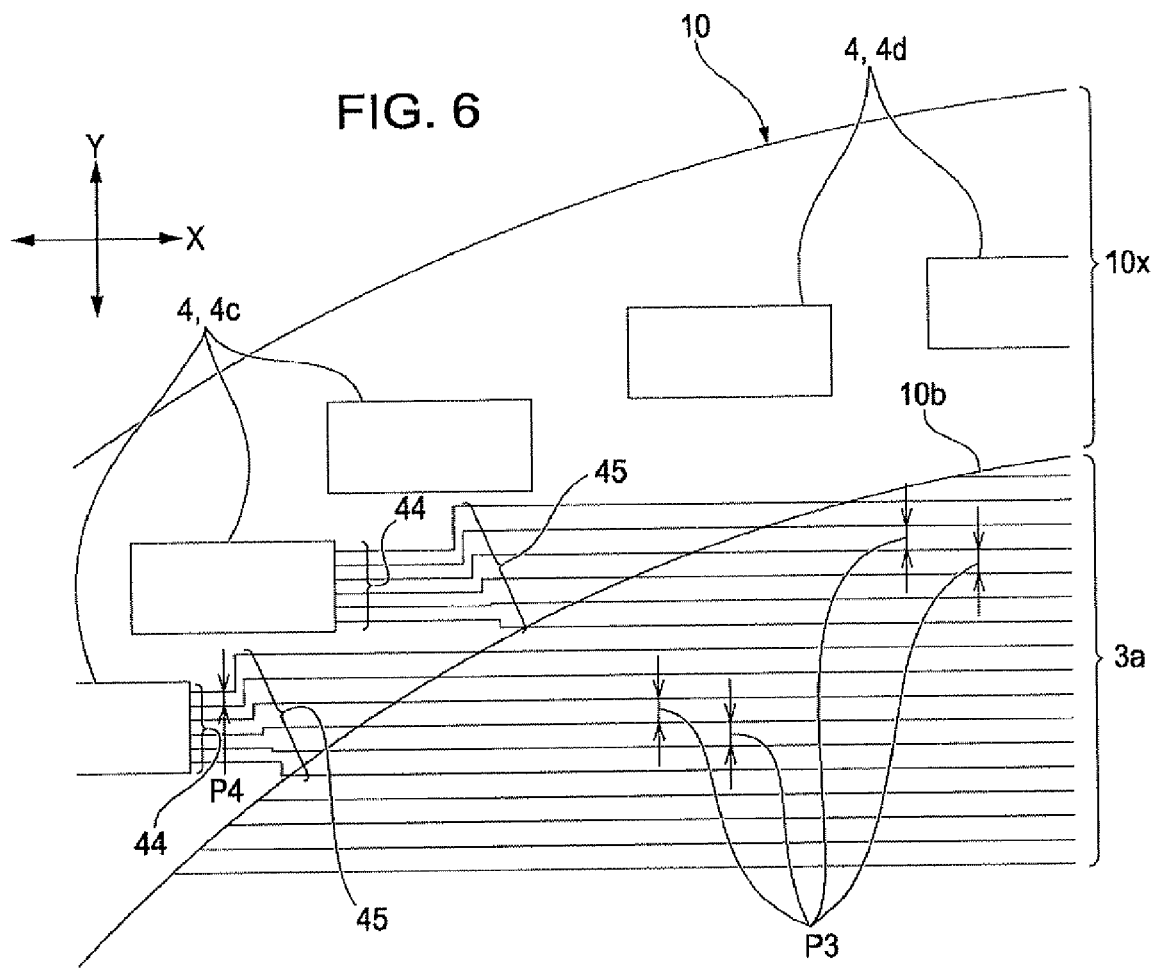
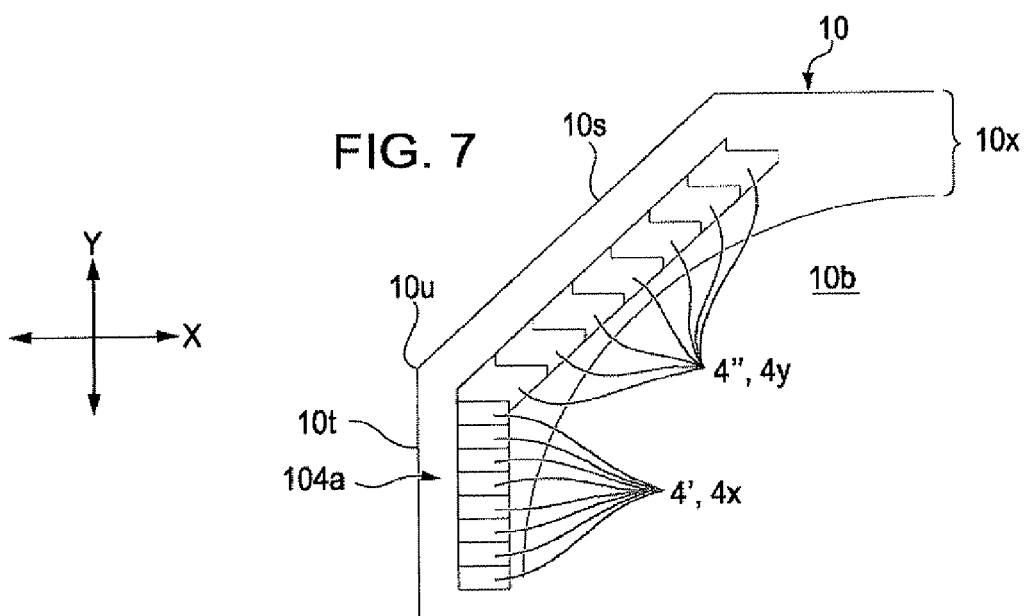

ELECTRO-OPTICAL DEVICE

CROSS REFERENCES TO RELATED APPLICATIONS

The present application is a continuation application of U.S. patent application Ser. No. 17/876,951, filed on Jul. 29, 2022, which application is a continuation of U.S. patent application Ser. No. 17/371,846, filed on Jul. 9, 2021, issued as U.S. Pat. No. 11,404,017, which application is a continuation of U.S. patent application Ser. No. 16/906,807, filed on Jun. 19, 2020, issued as U.S. Pat. No. 11,062,668 on Jul. 13, 2021, which application is a continuation of U.S. patent application Ser. No. 15/453,484, filed on Mar. 8, 2017, issued as U.S. Pat. No. 10,692,453 on Jun. 23, 2020, which application is a continuation of U.S. patent application Ser. No. 12/211,425, filed on Sep. 16, 2008, issued as U.S. Pat. No. 9,626,900 on Apr. 18, 2017, which application claims priority to Japanese Priority Patent Application JP 2008-164115 filed in the Japan Patent Office on Jun. 24, 2008, Japanese Priority Patent Application JP 2008-164114 filed in the Japan Patent Office on Jun. 24, 2008, Japanese Priority Patent Application JP 2007-291596 filed in the Japan Patent Office on Nov. 9, 2007, and Japanese Priority Patent Application JP 2007-274733 filed in the Japan Patent Office on Oct. 23, 2007, the entire content of which is hereby incorporated by reference.

BACKGROUND

1. Technical Field

The present invention relates to an electro-optical device such as a liquid crystal device, an organic electro luminescence (hereinafter, referred to as an organic EL) device, a plasma display device, an electrophoresis display device, or a device using an electron discharging element.

2. Related Art

As major electro-optical devices, there are liquid crystal devices, organic EL devices, and the like. In the electro-optical devices, a pixel area, in which a plurality of pixels corresponding to intersections of a plurality of scanning lines and a plurality of data lines that extend in directions for intersecting each other is arranged, is disposed on a component substrate. On the outside of the pixel area in the direction of extension of the plurality of scanning lines, a scanning line driving circuit that outputs signals to the scanning lines is disposed. In addition, in the direction of extension of the plurality of data lines, a data line driving circuit that outputs signals to the plurality of data lines is disposed. In addition, in an area outside the pixel area in the direction of extension of the scanning lines or the data lines, a connection terminal to which a flexible substrate for receiving a signal supplied from the outside the component substrate or the like is connected is disposed. In addition, between the area in which the driving circuit or the connection wiring is disposed and the scanning lines or the data lines, an area in which a connection wiring for connecting the above-described area and the scanning lines or the data lines is led out is provided.

In the electro-optical device configured as described above, both the component substrate and the pixel area have two-dimensional rectangular shapes. Accordingly, in the scanning line driving circuit, unit circuits that are in one-to-one correspondence with the plurality of scanning lines are disposed along the side of the pixel area.

In addition, as the electro-optical device, a device that has a circular pixel area on a component substrate having a hexagon shape has been proposed (see JP-A-2006-276361 (FIG. 12)).

In the electro-optical device disclosed in JP-A 2006-276361, the scanning line driving circuit is disposed in the direction of extension of the data lines and is not disposed in the direction of extension of the scanning lines. However, when the scanning line driving circuit is disposed in a straight line in the direction of the data lines, in the above-described electro-optical device, an outside area of the pixel area on the component substrate is needed to be formed to have a large width. Accordingly, there is a problem that the size of the electro-optical device becomes large, relative to the size of the pixel area.

SUMMARY

An advantage of some aspects of the invention is that it provides an electro-optical device in which a driving circuit for signal lines can be disposed along an irregular part in a case where an outer peripheral part of the pixel area located in the direction of extension of the signal lines is formed of the irregular part including a curved portion or a bent portion.

In addition, as shown in FIG. 15A, when a circular pixel area 10b is configured on a component substrate 10 having an irregular shape other than a rectangle, the length of the data line driving circuit 101 is much shorter than the width of the pixel area 10. Thus, it is impossible to extend the data lines 6a in straight lines. Accordingly, as shown in FIG. 15B, in a lead-out area (wiring area) of the data lines 6a, the data lines 6a are needed to be led out to the data line driving circuit 101 by extending to be parallel as possibly as can be and being bent in needed spots.

However, as shown in FIG. 15B, when the data lines 6a are led out, the lead-out parts of the data lines 61 have a large pitch for the data lines extending in the center of the pixel area 10b. On the other hand, the lead-out parts of the data lines 6a extending on both sides of the pixel area 10b have a very small pitch. Accordingly, there are areas in which the pitches are extremely different. Thus, as shown in FIG. 16A, there is a small capacitance component that is parasite between the lead-out parts of adjacent data lines 6a for the data lines located in the center of the pixel area 10a, and accordingly, a rate of rise of the voltage level is high. On the other hand, there is a large capacitance component that is parasite between the lead-out parts of adjacent data lines 6a for the data lines located on both ends of the pixel area 10a, and accordingly, a rate of rise of the voltage level is low. As a result, when an image is displayed in the pixel area 10b, distinctive differences in the gray scale levels or luminance levels are generated between the center of the pixel area 10b and both sides of the pixel area 10b. Therefore, there is a problem that the quality of images becomes low.

The configurations shown in FIGS. 15A and 15B are reference examples that have been devised by the inventor of the invention and are not known examples.

According to a first aspect of the invention, there is provided an electro-optical device (an electro-optical device 100) including: first and second signal lines that extend in directions for intersecting each other on a component substrate (component substrate 10); a pixel area (pixel areas 10a and 10b) in which a pixel electrode (a pixel electrode 9a) is disposed in correspondence with an intersection of the first signal line (a scanning line 3a or a data line 6a) and the second signal line (a data line 6a or a scanning line); a signal output circuit (scanning driving circuits 104a and 104b or a data line driving circuit 101) that is disposed outside the pixel area and outputs a driving signal to the first signal line; and a connection wiring (an output line 44 or an output line 46) that connects the signal output circuit and the first signal line together. An outer peripheral edge of the pixel area has a curved portion or a bent portion in a portion facing the signal output circuit, and the signal output circuit includes a plurality of circuit blocks (circuit blocks 4a, 4b, 4c, 4d, 4x, and 4y), and the circuit blocks are arranged along the curved portion or the bent portion of the portion facing the signal output circuit with deviated between adjacent circuit blocks in the direction of extension of the first signal line and/or the direction of extension of the second signal line.

According to the above-described electro-optical device, even when the outer peripheral edge part of the pixel area which is located in the direction of extension of the first signal line has an irregular shape including a curved portion or a bent portion, the signal output circuit constituted by a plurality of the circuit blocks can be disposed along the irregular outer peripheral edge. Accordingly, even when the signal output circuit is disposed in the vicinity of the pixel area, the width of the outside area of the pixel area, that is, the width of the frame area of the component substrate does not increase. Therefore, an electro-optical device that is appropriate for miniaturization can be implemented.

In the above-described electro-optical device, it may be configured that each of the plurality of the circuit blocks includes one or a plurality of unit circuit blocks (unit circuit blocks 4, 4', and 4"), each of the unit circuit blocks includes a plurality of unit circuits (unit circuits 40) that output a driving signal to the first signal line, and the unit circuit is connected to the first signal line through a connection wiring, and a wiring pitch of the connection wirings which connects the plurality of unit circuits to the first signal line is smaller than a wiring pitch of the first signal lines connected to the connection wiring.

In such a case, when the signal output circuit is configured by one type of the unit circuit blocks having a same two-dimensional configuration, the configuration of the signal output circuit can be simplified, and accordingly, design thereof can be easily performed. In descriptions here, the two-dimensional configuration of the unit circuit block means the two-dimensional size and the plane shape of the circuit block.

In addition, in the circuit block, it is preferable that the wiring pitch of the connection wirings that extend from the plurality of the unit circuits and are connected to the first signal lines is smaller than the wiring pitch of the first signal lines connected to the connection wiring. In such a case, even when the circuit blocks are deviated in the direction of extension of the first signal lines and/or the direction of extension of the second signal lines, wirings can be led out between the circuit blocks in an easy manner.

In the above-described electro-optical device, it is preferable that at least a part of the plurality of the unit circuit blocks has different amounts of deviation between adjacent unit circuit blocks in the direction of extension of the first signal line and/or different amounts of deviation between the adjacent unit circuit blocks in the direction of extension of the second signal line. In such a case, since the circuit blocks can be arranged along the curved portion of the pixel area more accurately, the width of the outer area of the irregular portion constituted by the curved portion or the bent portion can be reduced further.

In the above-described electro-optical device, when at least a part of the plurality of the circuit blocks is arranged along the outer peripheral edge of the pixel area with deviated between adjacent circuit blocks in both the direction of extension of the first signal line and the direction of extension of the second signal line, the circuit blocks can be arranged along the irregular portion constituted by the curved portion or the bent portion of the pixel area more accurately, and accordingly, the width of the outer area of the curved portion can be reduced further.

In the above-described electro-optical device, the component substrate may have an outer peripheral edge disposed approximately along the outer peripheral edge of the pixel area. In such a case, even when the shape of the component substrate has the outer peripheral edge that is disposed approximately along the outer peripheral edge of the pixel area, the signal output circuit can be disposed on the component substrate. Accordingly, the frame area of the component substrate does not have a large width, and thereby, an electro-optical device that is appropriate for miniaturization can be implemented.

In the above-described electro-optical device, the signal output circuit may be disposed on both sides in the direction of extension of the first signal line. Alternatively, the signal output circuit may be disposed on one side in the direction of extension of the first signal line. In such a case, even when the signal output circuit is disposed on both sides or one side, an electro-optical device corresponding thereto can be implemented.

In the above-described electro-optical device, it may be configured that the first signal line is a scanning line and the signal output circuit is a scanning line driving circuit. Alternatively, it may be configured that the first signal line is a data line and the signal output circuit is a data line driving circuit. In such a case, an electro-optical device corresponding to the scanning line driving circuit or the data line driving circuit can be implemented.

According to a second aspect of the invention, there is provided an electro-optical device (an electro-optical device 100) including: a first signal line (a scanning line 3a or a data line 6a) and a second signal line (the data line 6a or the scanning line 3a) that extend in directions for intersecting each other on a component substrate (a component substrate 10); a pixel area (pixel areas 10a and 10b) in which a pixel electrode (a pixel electrode 9a) is disposed in correspondence with an intersection of the first and second signal lines; a signal output circuit (a scanning line driving circuit 104, a data line driving circuit, or a connection terminal connected to a flexible substrate or the like) that is disposed outside the pixel area and outputs a driving signal to the second signal line; and a connection wiring (an output line 46 or an output line 44) that connects the signal output circuit and the second signal line together. An outer peripheral edge of the pixel area has a curved portion or a bent portion in a portion facing the signal output circuit, and a length of an area, in the direction perpendicular to the second signal line, in which the signal output circuit is disposed is shorter than a width of the pixel area in the direction perpendicular to the direction of extension of the second signal line. In addition, in an area in which the connection wiring is wired, a plurality virtual reference lines (virtual reference lines L (virtual reference lines Li, L2, L3, and L4) set to cross the area, a plurality of virtual reference points set to be spaced by predetermined gaps on the virtual reference line, and virtual connection wirings that connect the virtual reference points of adjacent virtual reference lines (a virtual reference point F) are disposed. In addition, the connection wiring (a virtual connection wiring Q (virtual connection wirings Q1, Q2, and. Q3)) is wired through the virtual connection wirings or along the virtual connection wirings.

According to the above-described electro-optical device, the curved portion or the bent portion is configured to face the outer peripheral edge of the pixel area on a side facing the area in which the signal output circuit is disposed. In addition, the length (for example, the size of an area, in which the data line driving circuit 101 (signal output circuit) is disposed, in a direction perpendicular to the direction of extension of the data line 6a (a second signal line)) of the area in which the signal output circuit is disposed is shorter than the width (for example, the size of the pixel area 10b in the direction perpendicular to the direction of extension of the data line 6a (a second signal line)) of the pixel area. Accordingly, in the area in which the connection wiring (for example, the output line 46) is wired, a small-width area that is curved or bent exists.

However, according to the above-described electro-optical device, the connection wirings, in areas interposed between the plurality of virtual reference lines set to cross the area in which the connection wirings are wired, are led out and wired through the virtual connection line that connects the plurality of the virtual reference points set to have predetermined gaps on the plurality of the virtual reference lines or along the virtual connection wirings. Thus, in the area interposed between the virtual reference lines, there is not a big difference in the gaps between adjacent connection wirings. Accordingly, between a connection wiring connected to the second signal line located in the center of the pixel area and a connection wiring that is connected to the second signal line that is located on both ends of the pixel area, there is not a big difference in gaps between adjacent connection wirings. Accordingly, there is not a big difference between capacitance components that are parasite between the lead-out parts of the adjacent connection wirings, and therefore, there is not a big difference in rates of rise of the voltage levels. Thus, when an image is displayed in the pixel area, there are no differences in the gray scale levels and the luminance levels between the center of the pixel area and the both ends of the pixel area, and accordingly, the quality of images becomes high.

In the above-described electro-optical device, it may be configured that the predetermined gaps have same intervals and the plurality of virtual reference lines are set in four or more spots in the area in which the connection wiring is wired. In such a case, by setting the virtual reference points to be equally spaced, there is not a big difference in the gaps between adjacent connection wirings. In addition, by setting the virtual reference lines in four spots or more, the connection wiring can be led out appropriately in many cases.

In the above-described electro-optical device, the plurality of virtual reference lines may be set to be parallel to one another. In such a case, the lead-out parts of the connection wirings can be designed in an easy manner.

In the above-described electro-optical device, ail the plurality of virtual reference lines may extend in a direction perpendicular to the direction of extension of the second signal line within the pixel area. In such a case, the lead-out parts of the connection wirings can be designed in an easy manner.

In addition, in the above-described electro-optical device, in the component substrate, an area in which a second signal output circuit that outputs a driving signal to the first signal line may be disposed outside the pixel area, and at least a part of the area in which the connection wiring is wired may be located between the pixel area and the area in which the second signal output circuit is disposed. In other words, when at least a part of the area in which the connection wirings are wired is located between the pixel area and the area in which the second signal output circuit is disposed, the width of the area in which the connection wirings are wired decreases in that degree. However, even under the restriction, according to the above-described electro-optical device, the connection wirings can be led out appropriately.

In the above-described electro-optical device, it may be configured that the second signal line is a data line and the signal output circuit is a data line driving circuit. Alternatively, it may be configured that the second signal line is a scanning line and the signal output circuit is a scanning line driving circuit. In such a case, an electro-optical device corresponding to the data line driving circuit or the scanning line driving circuit, can be implemented.

In the above-described electro-optical device, the two-dimensional shape of the pixel area may be a circle or be formed by combining curves and straight lines. In descriptions here, a "circle" includes any one among a compete circle, an oval, the shape of an athletics track (an oval type or a rounded-angle rectangle type) acquired from combining semi-circles to both shorter sides of a rectangle, and a shape including a circle in its outer peripheral edge. In addition, in descriptions here, a "circle" includes a circle having more or less concaves and convexes or stepped parts on the circumference.

In addition, in the above-described electro-optical device, the two-dimensional shape of the component substrate may be a circle, triangle, or polygon having five or more vertexes or be formed by combining curves and straight lines. In such a case, the outer peripheral shape of the component substrate can be formed in correspondence with the outer peripheral shape of the pixel area, and accordingly, the width of the outer area of the irregular portion constituted by the curved portion or the bent portion can be reduced further.

When the invention is applied to a liquid crystal device, a liquid crystal layer is configured to be held between the component substrate and an opposing substrate that is disposed to face the component substrate.

When the invention is applied to an organic EL device, organic EL elements are configured to be included in the plurality of pixels on the component substrate.

The electro-optical device according to an embodiment of the invention is used as a direct-viewing type display unit or the like in an electronic apparatus such as a clock or a cellular phone.

Additional features and advantages are described herein, and will be apparent from the following Detailed Description and the figures.

BRIEF DESCRIPTION OF THE DRAWINGS

The invention will be described with reference to the accompanying drawings, wherein like numbers reference like elements.

FIG. 6 is an enlarged schematic plan view showing a connection part of a circuit block disposed in an outer area of the pixel area and a scanning line in the component substrate of the electro-optical device according to Embodiment 1.

FIG. 7 is a schematic plan view showing disposition of circuit blocks in an outside area of a pixel area of a component substrate of an electro-optical device according to Embodiment 2 of the invention.

DETAILED DESCRIPTION

Figure 1:
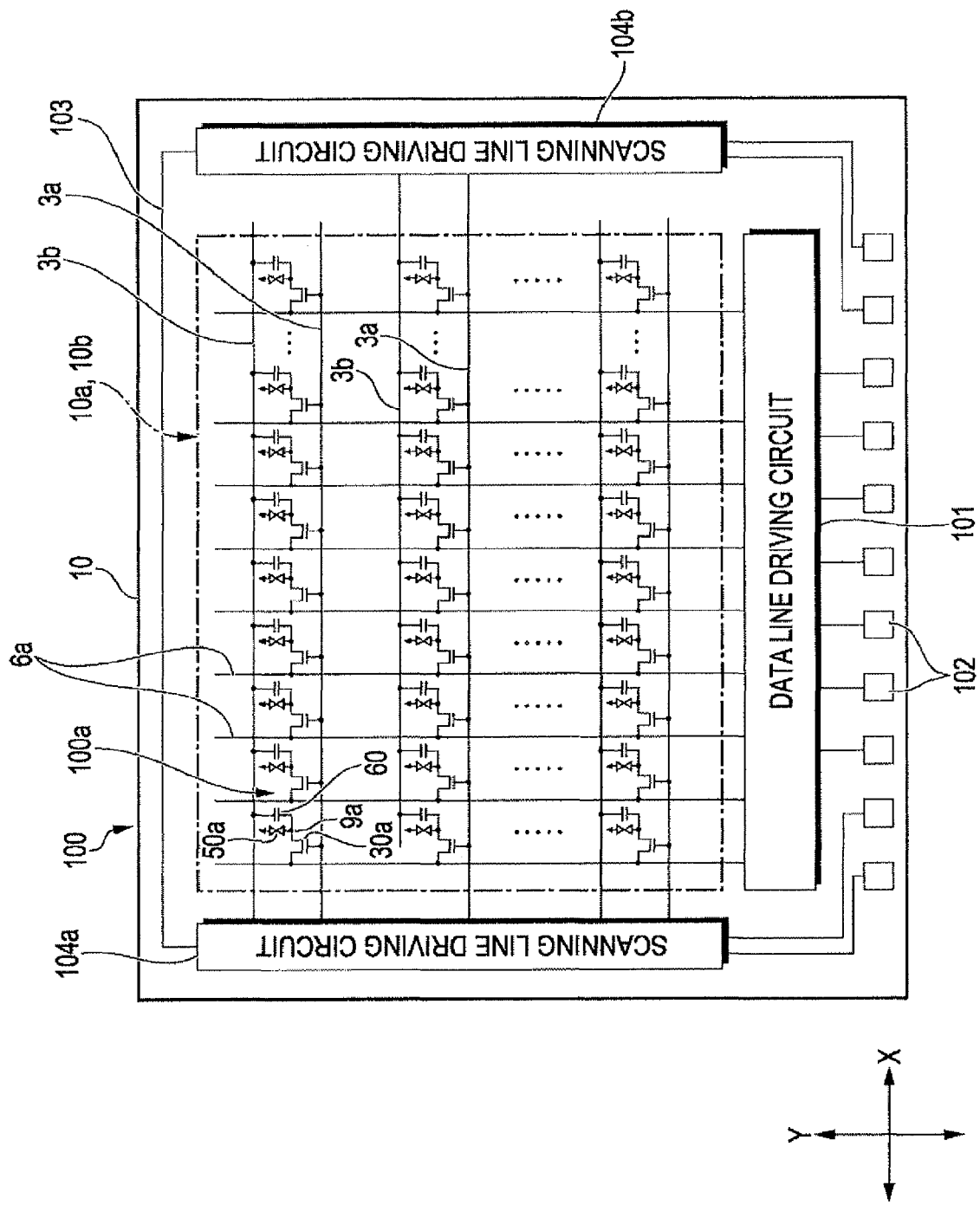
FIG. 1 is a block diagram showing the electrical configuration of an electro-optical device (liquid crystal device) according to Embodiment 1 of the invention.

Embodiments of the present application will be described below in detail with reference to the drawings.

Hereinafter, embodiments of the present invention will be described. In drawings referred to in descriptions below, in order to represent layers and constituent members in sizes recognizable in the drawings, scales are changed for each of the layers and the constituent members. In thin film transistors, a source and a drain are interchanged in accordance with an applied voltage. However, in the descriptions below, for the convenience of description, a side to which a pixel electrode is connected is described as the drain. In addition, a color filter, an alignment film, and the like are omitted in the drawings.

Embodiment 1

Overall Configuration

FIG. 1 is a block diagram showing the electrical configuration of an electro-optical device (liquid crystal device) according to Embodiment 1 of the invention. As shown in FIG. 1, the electro-optical device 100 according to this embodiment is a liquid crystal device. On a component substrate 10 of the electro-optical device 100, a plurality of pixels 100a is formed in positions corresponding to intersections of a plurality of scanning lines 3a (first signal lines) and a plurality of data lines 6a (second signal lines) that extend in directions x and y intersecting each other. In addition, on the component substrate 10, a pixel area 10b is configured by an area in which the plurality of pixels 100a is arranged, and the pixel area 10b is used as an image display area 10a for displaying an image in the electro-optical device 100. However, dummy pixels that do not directly contribute to display may be formed along the outer peripheral edge of the pixel area 10b. In such a case, the image display area 10a is configured by an area excluding the dummy pixels from the pixel area 10b.

On the component substrate 10, in an area located on the outside of the pixel area 10b, scanning line driving circuits 104a (signal output circuits) and 104b (signal output circuit) are formed on both sides of the area in which the scanning lines 3a extend, and, a data line driving circuit 101 (signal output circuit) is formed on a side on which the data lines 6a extend. The scanning line driving circuits 104a and 104b and the data line driving circuit 101 may be formed by using thin film transistors that are formed on the component substrate 10 by using SOG (system on glass) technology. Alternatively, the scanning line driving circuits 104a and 104b and the data line driving circuit 101 may be mounted as driving ICs on the component substrate 10. In any case, the scanning line driving circuits 104a and 104b serve as areas in which a signal output circuit for end parts of the scanning lines 3a is disposed. Thus, all the scanning lines 3a are drawn out to the scanning line driving circuits 104a and 104b through connection wirings 44.

The electro-optical device 100 shown in FIG. 1 has a so-called two-side-input structure in which the scanning line driving circuits 104a and 104b are connected to both sides including the left and right sides of the scanning lines 3a. Thus, the scanning line driving circuits 104a and 104b disposed on both sides are configured by circuits having a same configuration. The scanning line driving circuits 103a and 104b are driven in synchronization with each other, and accordingly, the scanning lines 3a are simultaneously driven by the scanning line driving circuits 104a and 104b on both sides. By simultaneously inputting driving signals that are transmitted from the scanning line driving circuits 104a and 104b to the scanning lines 3a from both sides, a decrease of driving signals due to resistance components of the scanning lines 3a and an operation failure due to delay can be prevented. Accordingly, reliability of the electro-optical device 100 can be improved. The scanning line driving circuits 104a and 104b are not needed to be connected on both sides of the scanning lines 3a, and thus, the scanning lines 3a may be alternately connected to the left-side scanning line driving circuit 104a and the right-side scanning line driving circuit 104b for each one or a plurality of lines. Alternatively, it may be configured that the scanning lines 3a are divided into upper and lower parts with respect to the scanning direction and the upper or lower part of the scanning lines 3a is connected to one of the scanning line driving circuits 104a or 104b on one side, or the scanning line driving circuits 104a and 104b are disposed on only one side of the pixel area 10b to be connected to all the scanning lines 3a.

On the other hand, the data line driving circuit 101 serves as an area in which a signal output circuit for end parts of the data lines 6a is disposed. Thus, all the data lines 6a are connected to the data line driving circuit 101 through connection wirings 46. In this embodiment, among the scanning line driving circuits 104a and 104b and the data line driving circuit 101, the scanning line driving circuits 104 are formed by using thin film transistors formed on the component substrate 10, and the data line driving circuit 101 is configured by a driving IC mounted on the component substrate 10.

In each of the plurality of pixels 100a, a pixel electrode 9a and a thin film transistor 30a (pixel transistor) for switching a pixel which is used for controlling the pixel electrode 9a are formed. Each data line 6a extending from the data line driving circuit 101 is electrically connected to a source of the thin film transistor 30a, and the data line driving circuit 101 supplies image signals to the data lines 6a in a line sequential manner. Each scanning line 3a connected to the scanning line driving circuits 104a and 104b is electrically connected to a gate of the thin film transistor 30a, and the scanning line driving circuits 104a and 104b supply scanning signals to the scanning lines 3a in a line sequential manner. The pixel electrode 9a is electrically connected to the drain of the thin film transistor 30a. In the electro-optical device 100, by turning on the thin film transistor 30a only for a predetermined time, the image signal supplied from the data line 6a is written into a liquid crystal capacitor 50a of each pixel 100a at a predetermined timing. The image signal of a predetermined level which is written into the liquid crystal capacitor 50a is maintained between the pixel electrode 9a formed on the component substrate 10 and a common electrode of an opposing substrate to be described later, for a predetermined time. Between the pixel electrode 9a and the common electrode, a holding capacitor 60 is formed. The voltage of the pixel electrode 9a is, for example, maintained for a time interval having a value three digits longer than a time interval in which the source voltage is applied. Accordingly, the charge-holding characteristic is improved, and thereby the electro-optical device 100 capable of displaying an image having a high contrast ratio is implemented. In this embodiment, for configuring the holding capacitor 60, the capacitance line 3b is formed to be in parallel with the scanning line 3a. However, the holding capacitor 60 may be formed between the scanning line 3a and a scanning line 3a located on the previous stage. In addition, in the liquid crystal device of a fringe field switching (FFS) mode, the common electrode, similarly to the pixel electrode 9a, is formed on the component substrate 10.

Detailed Configuration of Electro-optical Device 100

FIGS. 2A and 2B and FIGS. 3A and 3B are plan views of the electro-optical device 100 according to Embodiment 1 of invention and plan views of the component substrate 10 thereof. FIGS. 4A and 4B are a plan view of two adjacent pixels of the component substrate 10 of the electro-optical device 100 according to Embodiment 1 and a cross-section view of one pixel thereof. FIG. 4B is a cross-section view taken along line IVB-IVB shown in FIG. 4A. In FIG. 4A, the pixel electrode 9a is denoted by a long dotted line, the data line 6l and a thin film formed simultaneously with the data line 6a are denoted by a dashed dotted line, the scanning line 3a is denoted by a solid line, and a semiconductor layer is denoted by a short dotted line.

In this embodiment, the electro-optical device 100 is particularly configured as shown in FIGS. 2A, 2B, 3A, 3B, 4A, and 4B. First, on the component substrate the opposing substrate 20 and the component substrate 10 are bonded by a sealing member 107. In addition, in an area surrounded by the sealing member 107, a liquid crystal is held. The liquid crystal 50 is, for example, formed of one nematic liquid crystal, a mixture of several types of nematic liquid crystals, or the like. In addition, between the component substrate 10 and the opposing substrate 20, a conductive member (not shown) for electrical connection is disposed.

As shown in FIGS. 4A and 4B, on the component substrate 10, a plurality of transparent pixel electrodes 9a having a matrix shape is formed for each pixel 100a, and the data lines 6a and the scanning lines 3a extend along horizontal and vertical boundary areas of the pixel electrode 9a. In addition, on the component substrate 10, a capacitor line 3b is formed in parallel with the scanning line 3a.

A base body of the component substrate 10 shown in FIG. 4B is formed of a support substrate 10d such as a quartz substrate or a heat-resistant glass substrate, and a base body of the opposing substrate 20 is formed of a support substrate 20d such as a quartz substrate or, a heat-resistant glass substrate. In the component substrate 10, a bottom insulating layer 12 formed of a silicon dioxide film or the like is formed on the surface of the support substrate 10d. In addition, on the surface side of the bottom insulating layer 12, a thin film transistor 30a is formed in an area corresponding to the pixel electrode 9a. The thin film transistor 30a has an LDD (lightly doped drain) structure in which a channel region 1g, a lightly-doped source region 1b, a heavily-doped source region 1d, a lightly-doped drain region 1c, and a heavily-doped drain region 1e are formed with respect to a. semiconductor layer 1a having an island shape. On the surface side of the semiconductor layer 1a, a gate insulating layer 2 formed of a silicon dioxide film or a silicon nitride film is formed, and a gate electrode (scanning line 3a) is formed on the surface of the gate insulating layer 2. The semiconductor layer 1a is a poly silicon film that is poly-crystallized by forming an amorphous silicon film for the component substrate 10 and performing laser annealing, lamp annealing, or the like. In addition, the semiconductor layer in may be formed of a single-crystal silicon layer, and the gate insulating layer 2 may be formed by performing thermal oxidation for the surface of the semiconductor layer 1a.

On the upper layer side of the thin film transistor 30a, an interlayer insulating layer 71 formed of a silicon dioxide film or a silicon nitride film, an interlayer insulating layer 72 formed of a silicon dioxide film or a silicon nitride film, and an interlayer insulating film 73 (planarizing film) formed of a thick photosensitive resin having a thickness of 1.5 to 2.0 μm are formed. On the surface of the interlayer insulating layer 71 (between the interlayer insulating films 71 and 72), the data line 6a and the drain electrode 6b are formed. In addition, the data line 6a is electrically connected to the heavily-doped source region id through a contact hole 71a that is formed in the interlayer insulating layer 71. In addition, the drain electrode 6b is electrically connected to the heavily-doped drain region 1e through a contact hole 71b formed in the interlayer insulating layer 71. On the surface of the interlayer insulating layer 73, the pixel electrode 9a formed of an ITO film is formed. The pixel electrode 9a is electrically connected to the drain electrode 6b through a contact hole 73a formed in the interlayer insulating layers 72 and 73. On the surface side of the pixel electrode 9a, an alignment film 16 formed of a polyimide film is formed. In addition, the scanning line 3a and the capacitor line 3b that is formed on the same layer as that of the scanning line 3a, as upper electrodes, face a part if (lower electrode) extending from the heavily-doped drain region 1e though an insulation film (dielectric film) that is formed simultaneously with the gate insulating layer 2, for forming the holding capacitor 60.

In this embodiment, the scanning line 3a and the capacitor line 3b are conductive films that are formed simultaneously and are formed of a metal group film such as a molybdenum film, an aluminum film, a titanium film, a tungsten film, a tantalum film, or a chrome film or a laminated film thereof. In addition, the data line 6a and the drain electrode 6b are conductive films that are formed simultaneously and are formed of a metal group film such as a molybdenum film, an aluminum film, a titanium film, a tungsten film, a tantalum film, or a chrome film or a laminated film thereof.

In an area, which is overlapped with the pixel electrode 9a that is formed on the component substrate 10, of the opposing substrate 20, a light shielding film 23 is formed. In addition, on the upper layer side of the light shielding film 23, the common electrode 21 formed of an ITO film is formed, and the alignment film 22 is formed on the surface of the common electrode 21. Here, when the electro-optical device 100 is configured for color display, color filters (not shown) are formed on the opposing substrate 20 for the plurality of the pixels 100a.

The component substrate 10 and the opposing substrate 20 which are configured as described above are disposed such that the pixel electrode 9a and the common electrode 21 face each other. In addition, between the component and opposing substrates 10 and 20, the liquid crystal 50 as an electro-optical material is sealed in a space surrounded by the sealing member 107 (see FIG. 2A). The liquid crystal 50 is aligned in a predetermined direction by the alignment films 16 and 22 in a state that an electric field is not applied from the pixel electrode 9a.

Figure 5A:
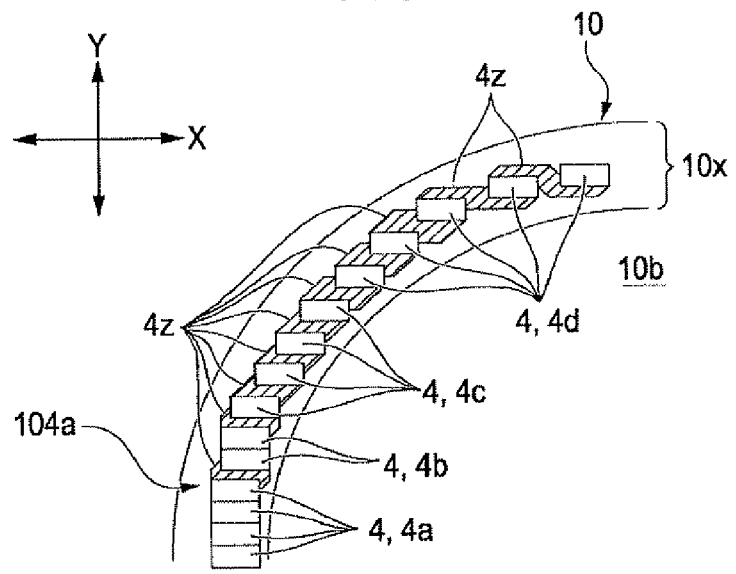
FIGS. 5A and 5B are a plan view showing disposition of a circuit block in an outside area of a pixel area in a component substrate of an electro-optical device according to Embodiment 1 and a diagram showing one circuit block.
Figure 5B:
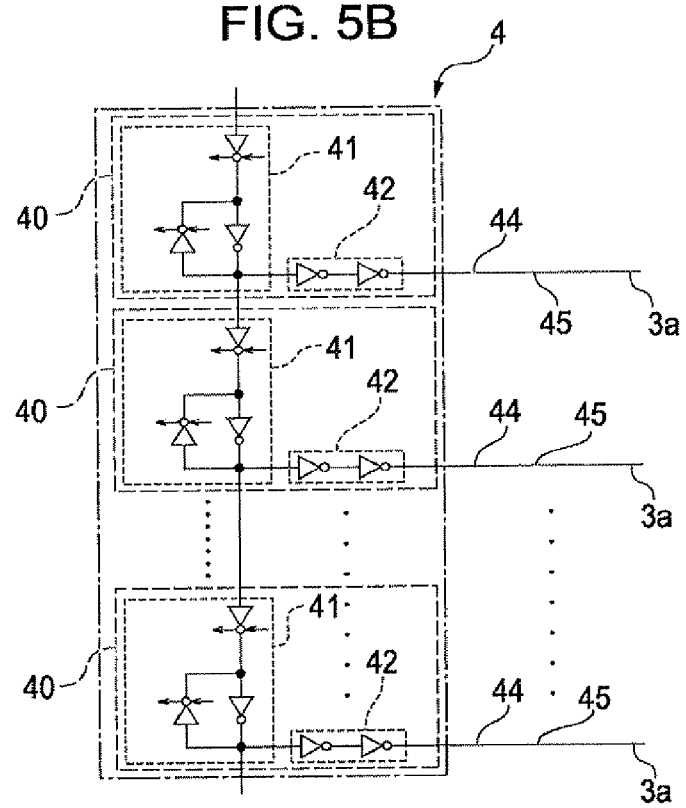

In this embodiment, although the electro-optical device 100 is configured as a transmission-type liquid crystal device, the electro-optical device 100 may be configured as a reflection-type liquid crystal device or a semi-transmissive reflection-type liquid crystal device. Configuration of Scanning line Driving Circuits 104a and 104b FIG. 5A is a schematic plan view showing disposition of circuit blocks in an area outside the pixel area 10b of the component substrate 10 of the electro-optical device 100 according to Embodiment 1 of the invention, and FIG. 5B is a diagram showing one circuit block. FIG. 6 is an enlarged schematic plan view showing a connection part of a circuit block disposed in an outer area of the pixel area 10b and the scanning line, in the component substrate 10 of the electro-optical device 100 according to Embodiment 1 of the invention. In FIG. 5A, the scanning line 3a, the capacitor line 3b, and the data line 6a that are located in the pixel area 10b are not shown. In addition, in FIG. 6, only a part of the scanning line, which is connected to the shown scanning line driving circuit, of wirings formed in the pixel area 10b is shown. In the figure, wirings interconnecting the capacitor line 3b, the data line 6a, and the circuit blocks are not shown, and the scanning line 3a connected to the scanning line driving circuit disposed on a side opposite to the pixel area is not shown. In addition, although the outer peripheral edge of the pixel area 10b has stepped parts along the pixel 100a, practically, the number of pixels 100 is larger than that shown in FIGS. 2A and 6, and the pixels are smaller than those shown in FIGS. 2A and 6. Thus, in FIGS. 2A, 5A, 5B, and 6, the pixel area 10b is represented as a complete circle.

Figure 2A:
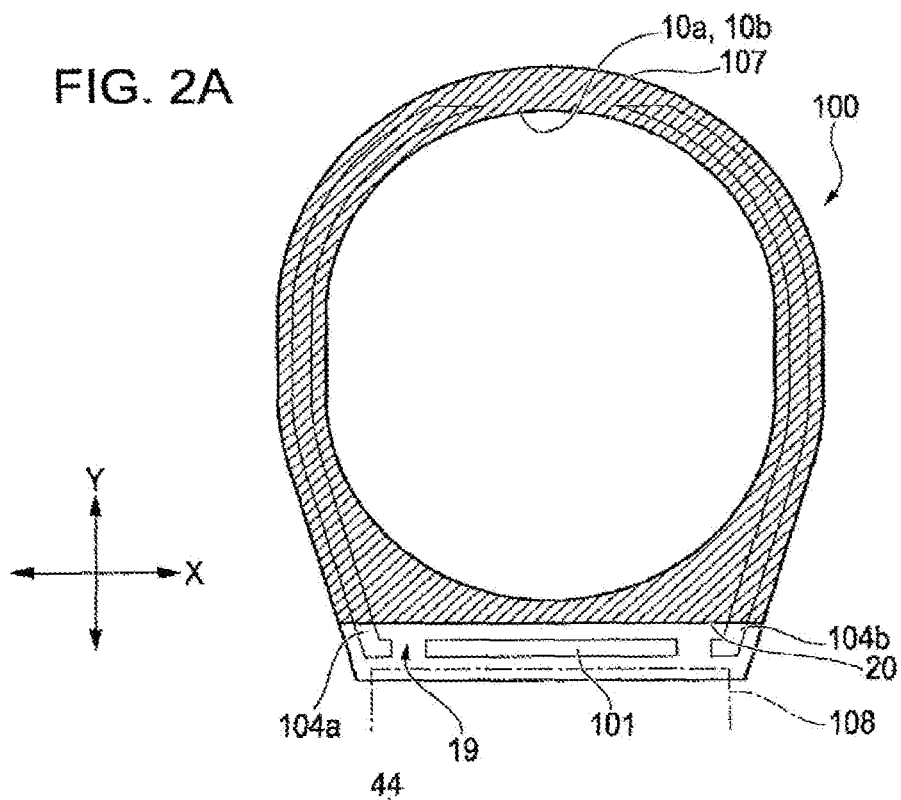
FIGS. 2A and 2B are a plan view of the electro optical device according to Embodiment 1 and a plan view of a component substrate thereof.
Figure 2B:
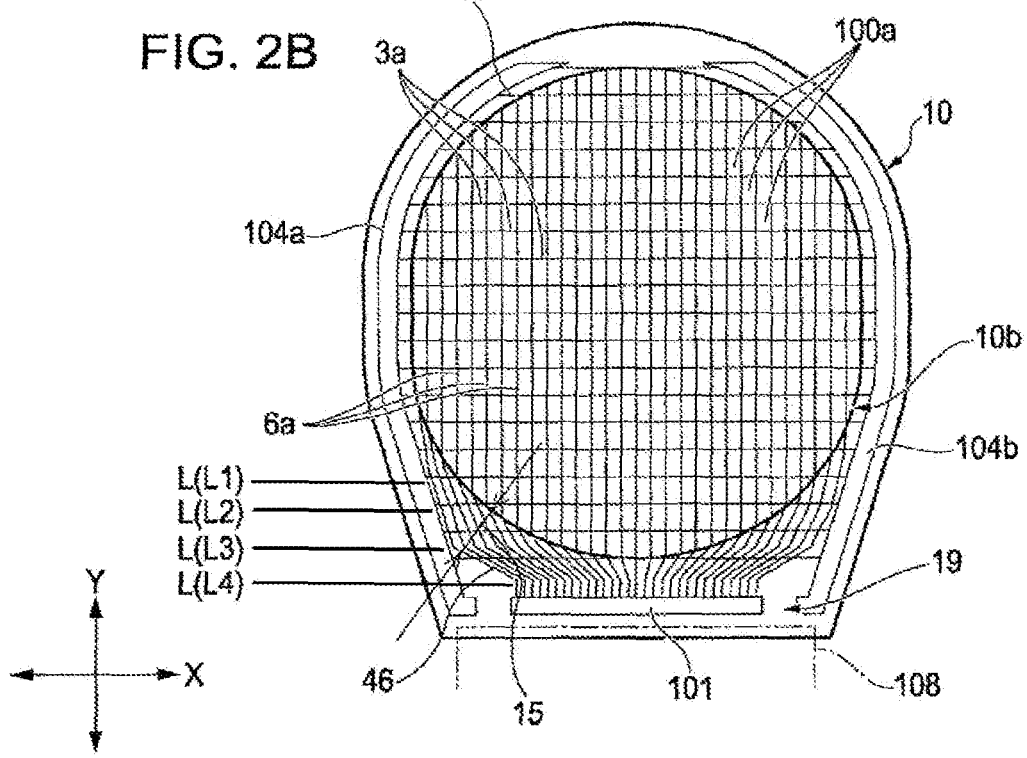
Figure 3A:
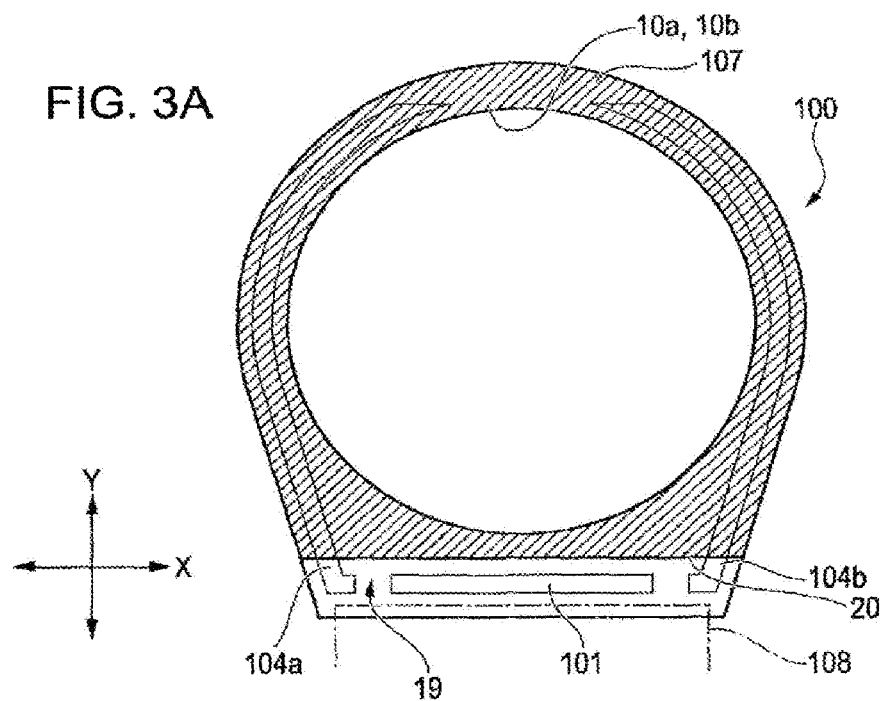
FIGS. 3A and 3B are a plan view of another electro optical device according to Embodiment 1 and a plan view of a component substrate thereof.
Figure 3B:
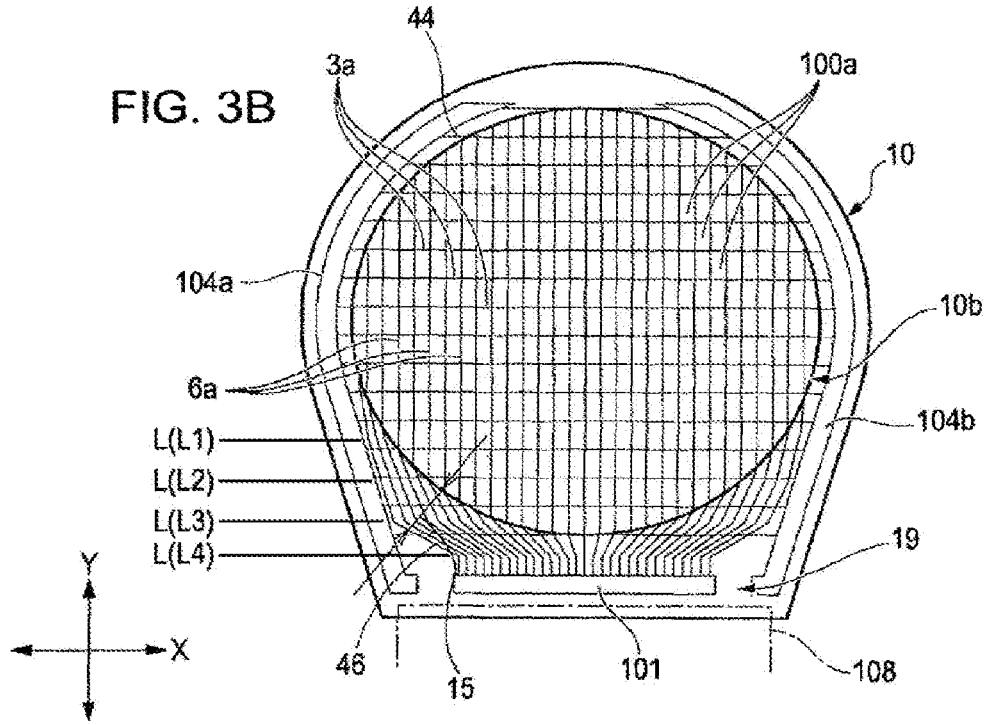
Figure 4A:
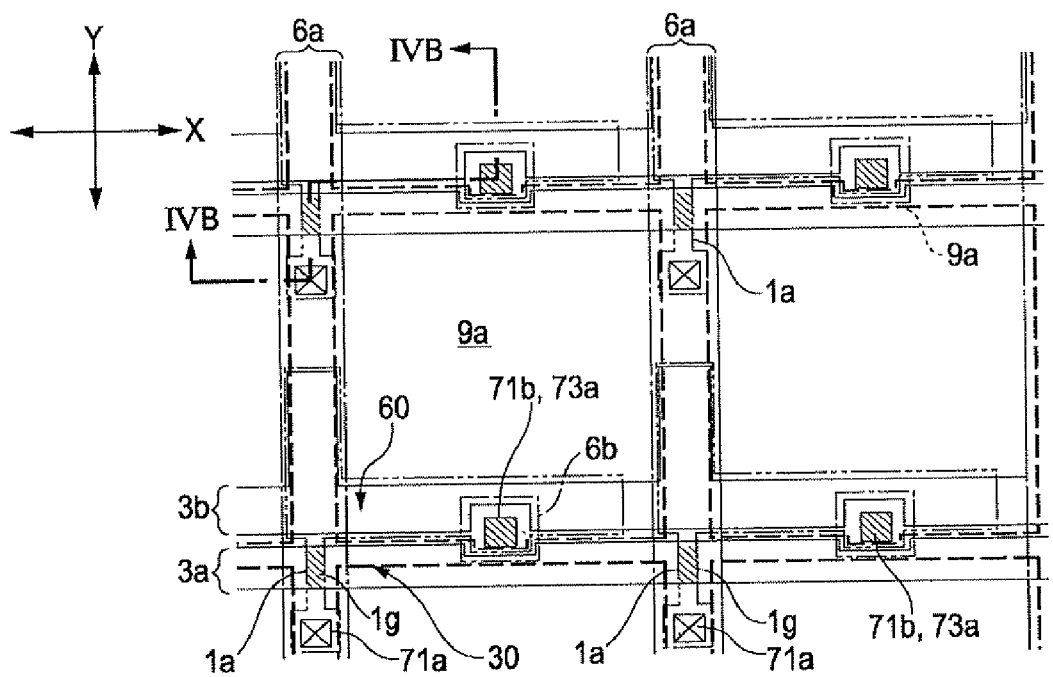
FIGS. 4A and 4B are a plan view of two adjacent pixels of the component substrate of the electro-optical device according to Embodiment 1 and a cross-section view of one pixel thereof.
Figure 4B:
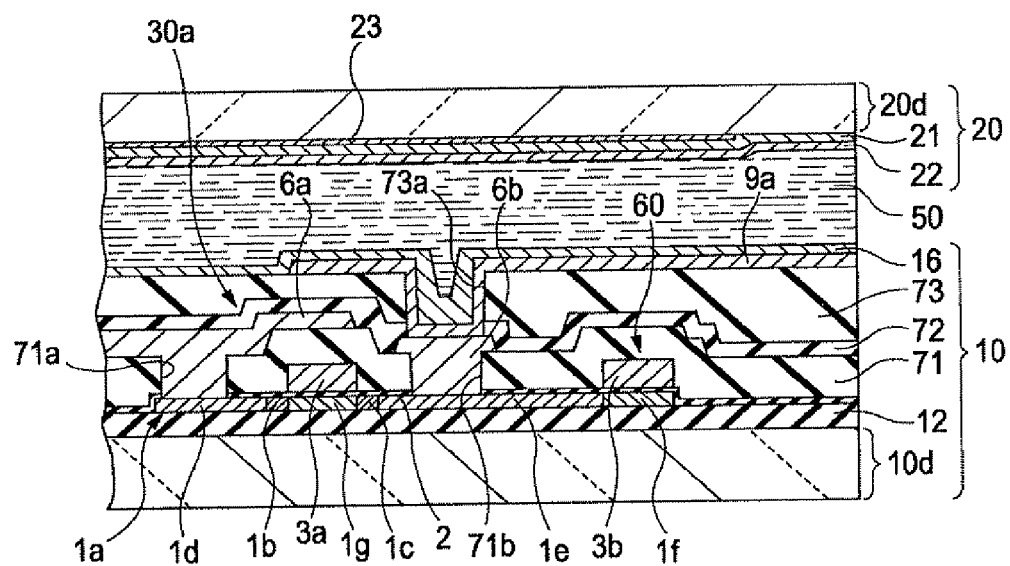

As shown in FIGS. 2A and 2B and FIGS. 3A and 3B, in the electro-optical device 100 according to this embodiment, the two-dimensional shape of the component substrate 10 is an irregular shape formed by combining semicircles and straight lines. In addition, in correspondence with the shape of the component substrate 10, the two-dimensional shape of the opposing substrate 20 has an irregular shape formed by combining semicircles and straight lines. In addition, the two-dimensional shape of the pixel area 10b is formed to be an oval shape having its vertical length slightly larger than its horizontal length, an elliptical shape (FIGS. 2A and 2B), or a perfect circular shape (FIGS. 3A and 3B). Accordingly, the pixel area 10b has irregular outer peripheral edge parts formed of curved portions in a portion facing the scanning line driving circuits 104a and 104b.

The component substrate 10 includes a pull-out area 19 that is pulled out from one end part of the straight line shape of the opposing substrate 20 in the direction of extension of the data lines 6 in the pixel area 10b. In this pull-out area 19, the data line driving circuit 101 is disposed along the side part of the pull-out area. In addition, a flexible substrate 108 is connected to a pad 102 that is formed in an end part of the pull-out area 19. In addition, in an outside area 10x of the pixel area 10b of the component substrate 10, the scanning line driving circuits 104a and 104b are disposed on a side located in the direction of extension of the scanning lines 3a. The scanning line driving circuits 104a and 104b are formed to extend along the outer peripheral edge of the component substrate 10.

In the above-described electro-optical device 100, the scanning line 3a is connected to the scanning line driving circuits 104a and 104b through the connection wirings 44. Since a part in which the pixel area 10b faces the scanning line driving circuits 104a, and 104b is an irregular curved shape in this embodiment, in order to implement such a structure, the following configuration is employed.

As shown in FIGS. 5A and 6, the scanning line driving circuits 104a and 104b have a plurality of the circuit blocks 4a, 4b, 4c, and 4d. The plurality of the circuit. blocks 4a, 4b, 4c, and 4d is aligned along the outer peripheral edge of the pixel area 10b with adjacent circuit blocks deviated from each other in the direction (direction X) of extension of the scanning lines 3a and/or the direction (direction Y) of extension of the data lines 6a.

Here, the circuit blocks 4a, 4b, 4c, and 4d are configured by one unit circuit block 4, as shown in FIG. 5B, or a plurality of the unit circuit blocks. The unit circuit block 4 includes a plurality of unit circuits 40 that output scanning signals to the end parts of the scanning lines 3a one to one. Each of the plurality of unit circuits 40 includes, for example, a shift resister 41 having two clocked inverters, one inverter and a buffer 42 having two inverters. In addition, output lines 44 that extend from the plurality of the unit circuits 40 are connected to the end parts of the scanning lines 3a. In the above-described circuit block 4, the plurality of the unit circuits 40 has an approximate same configuration such as a circuit configuration and a wiring structure, and pitches of the plurality of the output lines 44 are the same. As the buffer 42, a NOR gate or an AND gate may be used.

According to this embodiment, in the plurality of the circuit blocks 4a, 4b, 4c, and 4d shown in FIGS. 5A and 6, the configurations and numbers of the unit circuits 40 of the unit circuit blocks 4 and the number and pitches of the output lines 44 are the same. In addition, the unit circuit blocks 4 have a same two-dimensional configuration (the two-dimensional size or the two-dimensional shape). Thus, the scanning line driving circuit 101 is configured by one type of the unit circuit block 4.

The circuit blocks 4a, 4b, 4c, 4c, 4c, 4c, 4d, 4d, are configured by one or a plurality of the unit circuit blocks 4. The number of the unit circuit blocks 4 is appropriately selected so as to be easily disposed along the outer peripheral edge of the pixel area 10b. In the example shown in FIGS. 5A and 6, a circuit block 4a is configured by combining four unit circuit blocks 4, a circuit block 4b is configured by two unit circuit blocks 4, and each of circuit blocks 4c and 4d is configured by one unit circuit block 4.

In addition, the circuit blocks 4a, 4b, 4c, and 4d are disposed to be curved with adjacent circuit blocks deviated from each other in both or one of the direction (direction Y) of extension of the data lines 6a and the direction (direction X) of extension of the scanning lines 3a.

Here, the circuit blocks 4c, 4c, 4c, and 4c are arranged such that the mount of deviation between adjacent circuit blocks in the direction (direction Y) of extension of the data lines 6a and the amount of deviation between the adjacent circuit blocks in the direction (direction X) of extension of the scanning lines 3a are the same.

On the contrary, for the circuit blocks 4d, 4d, . . . , the amounts of deviation between adjacent circuit blocks in the direction (direction Y) of extension of the data lines 6a are different from one another, and the amounts of deviation between adjacent circuit blocks in the direction (direction X) of extension of the scanning lines 3a are different from one another. When the amount of deviation between adjacent circuit blocks 4d in the direction (direction X) of extension of the scanning lines 3a is larger than the length of the circuit block 4d in direction X, the circuit blocks 4d may be aligned in direction X.

As described above, the plurality of the circuit blocks 4a, 4b, 4c, and 4d are arranged in the shape of a curve so as to accurately follow the curved shape of parts, which face the scanning line driving circuits 104a and 104b, of the outer peripheral edge of the pixel area 10b. Accordingly, the scanning line driving circuits 104a and 104b are configured to be curved along the pixel area 10b.

As described above, the circuit blocks 4a, 4h, 4c, and 4d are arranged such that adjacent circuit blocks are deviated from each other in the direction (direction X) of extension of the scanning lines 3a. In other words, the circuit blocks are deviated from one another in the direction of inclination. Accordingly, the circuit blocks 4a, 4b, 4c, and 4d are needed to be connected together with wirings, and thus, a lead-out area 4z for the wirings is needed to be acquired.

Thus, in this embodiment, as shown in FIG. 6, the pitches P4 of the output lines 44 that are drawn out from the circuit blocks 4a, 4b, 4c, and 4d are smaller than the pitches P3 of the scanning lines 3a to which the output lines 44 are connected, in all the circuit blocks 4. In addition, between the output lines 44 and the scanning lines 3a, a relay part 45 that extends in the direction of extension of the data lines 6a is disposed for connecting the output lines 44 and the scanning lines 3a which have different pitches. Accordingly, even when the circuit blocks are deviated from one another in the direction (direction x) of extension of the scanning lines 3a, the lead-out area 4z of the wirings can be acquired sufficiently and easily.

Major Advantages of this Embodiment

As described above, in the outside area 10x of the pixel area 10b of the component substrate 10 used in the electro-optical device 100 according to this embodiment, the scanning line driving circuits 104a and 104b are disposed in areas positioned in the direction of extension of the plurality of the scanning lines 3a. In addition, the outer peripheral edge of the pixel area 10b has an irregular outer peripheral part formed of a curved portion in a portion facing the scanning line driving circuits 104a and 104b. Thus, in the scanning line driving circuits 104a and 104b, the unit circuits 40 that output signals to the scanning lines 3a in one to one correspondence cannot be disposed linearly. However, in this embodiment, the circuit blocks 4a, 4b, 4c, and 4d having the plurality of the unit circuits 40 are arranged along the outer peripheral edge of the pixel area 10b with being deviated in the direction (direction X) of extension of the scanning lines 3a and/or the direction (direction Y) of extension of the data lines 6a. Accordingly, even when the outer peripheral part located in the direction of extension of the scanning lines 3a is a curved portion, the scanning line driving circuits 104a and 104b can be disposed along the curved portion, As a result, the outside area 10x of the pixel area 10b is not needed to be configured to have a large width in the component substrate 10.

particularly in this embodiment, the plurality of the circuit blocks 4a, 4b, 4c, and 4d are configured to be deviated between adjacent circuit blocks in both directions including the direction (direction X) of extension of the scanning lines 3a and the direction (direction Y) of extension of the data lines 6a. In addition, in the plurality of the circuit blocks 4a, 4b, 4c, and 4d, the amounts of deviation of adjacent circuit blocks in the direction (direction X) of extension of the scanning lines 3a and the amounts of deviation in the direction (direction Y) of extension of the data lines 6a are configured to be different from each other. Thus, the circuit blocks 4a, 4b, 4c, and 4d can be arranged more accurately in correspondence with the curved portion of the pixel area 10b, and accordingly, the size of the width of the outside area 10x of the pixel area 10b can be compressed further.

In addition, the positions for each unit circuit 40 are not deviated along the outer peripheral shape of the pixel area 10b, and the positions of the circuit blocks 4a, 4b, 4c, and 4d each having one or a plurality of the unit circuit blocks 4 that respectively have a plurality of the unit circuits 40 are deviated along the outer peripheral shape of the pixel area 10b. Accordingly, layouts of the scanning line driving circuits 104a and 104b can be simplified, and thereby design can be performed in an easy manner. In addition, according to this embodiment, the circuit blocks 4a, 4b, 4c, and 4d that are respectively formed by one or a plurality of the unit circuit blocks 4 of one type in which the two-dimensional layouts of the unit circuits 40 are the same are used. Accordingly, the configurations of the scanning line driving circuits 104a and 104b can be simplified. Therefore, design can be performed in an easy manner.

In addition, the pitch 24 of the output lines 44 of the unit circuit block 4 is smaller than the pitch P3 of the scanning lines 3a that are connected to the output lines 44. Thus, even when the circuit blocks 4a, 4b, 4c, and 4d that are respectively configured by the unit circuit blocks 4 are deviated in the direction of extension of the scanning lines 3a, the lead-out area 4z of wirings among the circuit blocks 4a, 4b, 4c, and 4d can be sufficiently acquired.

Modified Example of Embodiment 1

According to the above-described Embodiment 1, in the plurality of the unit circuit blocks 4, the configurations and numbers of the unit circuits 40 and the numbers and pitches of the output lines 44 are the same, and the two-dimensional configurations (the two-dimensional sizes and shapes) of the unit circuit blocks 4 are the same. However, depending on the shape of the pixel area 10b, a plurality of types of unit circuit blocks 4 that have different two-dimensional configurations (the two-dimensional sizes and shapes) such as the configurations and numbers of the unit circuits 40 and the numbers and pitches of the output lines 44 are different may be employed.

Embodiment 2

FIG. 7 is a schematic plan view showing disposition of circuit blocks 4x and 4y in an outside area of a pixel area 10b of a component substrate 10 of an electro-optical device 100 according to Embodiment 2 of the invention. In FIG. 7, scanning lines 3a, capacitor lines 3b, and data lines 6a of the pixel area 10b are not shown. The basic configuration of the electro-optical device 100 according to this embodiment is the same as that according to Embodiment 1, and thus, to each common part, a same reference sign is assigned, and a description thereof is omitted here.

In Embodiment 1, as the unit circuit blocks 4 constituting the circuit blocks 4a, 4b, 4c, and 4d, only one type of the unit circuit blocks that have a same two-dimensional configuration (a two-dimensional size and shape) is used. However, as shown in FIG. 7, two or more types of the unit circuit blocks 4' and 4" that have different two-dimensional configurations (the two-dimensional sizes and shapes) may be used. In other words, according to this embodiment, the unit circuit block 4' and the unit circuit block 4" have a same number of the output lines 44 that have been described with reference to FIGS. 5B and 6 and have different pitches of the output lines 44. In addition, only one between the pitch of the output lines 44 of the unit circuit block 4' and the pitch of the output lines 44 of the unit circuit block 4" may be configured to be the same as the pitch of the scanning lines 3a that are connected to the output lines 44, or both pitches may be configured to be different from the pitch of the scanning lines 3a. In addition, the circuit block 4x is configured by one or a plurality of the unit circuit blocks 4', and the circuit block 4y is configured by one or a plurality of the unit circuit blocks 4".

Here, the component substrate 10 has straight-line parts 10s and 10t in portions facing the scanning line driving circuits 104a and 104b so as to follow the shape of the outer peripheral part of the pixel area 10b. The straight-line parts 10s and 10t are connected at an angle through a corner part 10u. In correspondence with the above-described configuration, in the plurality of the circuit blocks 4 constituting the scanning line driving circuit, circuit blocks 4x and 4y are linearly arranged in two spots following the two straight lines 10s and 10t of the component substrate 10. In other words, all the circuit blocks 4x are disposed in positions deviated between adjacent circuit blocks in the direction (direction Y) of extension of the data lines 6a, and are disposed not to be deviated in the direction {direction X) of extension of the data lines 6a but to be linear in the direction (direction Y) of extension of the data lines 3a so as to follow the straight line part 10t. In addition, in the circuit blocks 4x, the amounts of deviation of adjacent circuit blocks in the direction (direction Y) of extension of the data lines 6a are the same.

On the other hand, the circuit blocks 4y are deviated between adjacent circuit blocks in both the direction (direction Y) of extension of the data lines 6a and the direction (direction X) of extension of the scanning lines 3a. However, differently from the circuit blocks 4c and 4d of Embodiment 1, in the circuit blocks 4x, the amounts of deviation between adjacent circuit blocks in the direction (direction X) of extension of the scanning lines 3a are the same, and the amounts of deviation between adjacent circuit blocks in the direction (direction Y) of extension of the data lines 6a are the same. Accordingly, the circuit blocks 4y are arranged in the shape of a straight line at an angle so as to follow the straight part 10s.

As described above, also in this embodiment, the plurality of the circuit blocks 4x and 4y are arranged along the outer peripheral edge of the component substrate which approximately follows the curved shape of the parts of the pixel area 10b facing the scanning line driving circuits 104a and 104b, and accordingly, the scanning line driving circuits 104a and 104b are configured along the pixel area 10b. Accordingly, in the component substrate 10, the outside area 10x of the pixel area 10b can be configured to be narrowed.

Modified Examples of Embodiments 1 and 2

In the above-described embodiments, the data line driving circuit 101 that is a signal output circuit for the data lines 6a is configured by a driving IC that is mounted on the component substrate 10. However, the invention may be applied to an electro-optical device in which the data line driving circuit 101 is formed by using a thin film transistor that is formed on the component substrate 10 by using SOG (system on glass) technology. In addition, the invention may be applied to an electro-optical device in which the data line driving circuit 101 is not configured on the component substrate 10 and signals for the data lines 6a are output from an external circuit through a flexible substrate or the like connected to the component substrate 10. In such a case, an area (connection area) in which a connection terminal for the flexible substrate or the like is disposed serves as an area in which the signal output circuit for the data lines 6a is disposed. As described-above, the invention may be applied to the above-described electro-optical devices.

In addition, in the above-described embodiments, an example in which the scanning line driving circuits 104a and 104b are configured on both sides of the pixel area 10b has been described. However, the invention may be applied to an electro-optical device in which the scanning line driving circuit 104a or 104b is configured only on one side of the pixel area 10b.

In addition, in the above-described embodiments, the invention is applied for configuring the scanning driving circuits 104a and 104b. However, the invention may be applied for configuring the data line driving circuit 101. In other words, in the above-described embodiments, the scanning lines 3a have been described as the first signal lines, and the data lines 6a have been described as the second signal lines. However, the invention may be applied to an electro-optical device in which the scanning lines 3a are configured as the second signal lines and the data lines 6a are configured as the first signal lines.

In addition, in the above-described Embodiment 1, a poly-silicon film is used as the semiconductor layer 1a of the thin film transistor 30a. However, the invention may be applied to an electro-optical device 100 in which a single-crystal silicon layer or an amorphous silicon film is used as the semiconductor layer 1a of the thin film transistor 30a.

Embodiment 3

Lead-Out Structure of Data Line 6a

Figure 8:
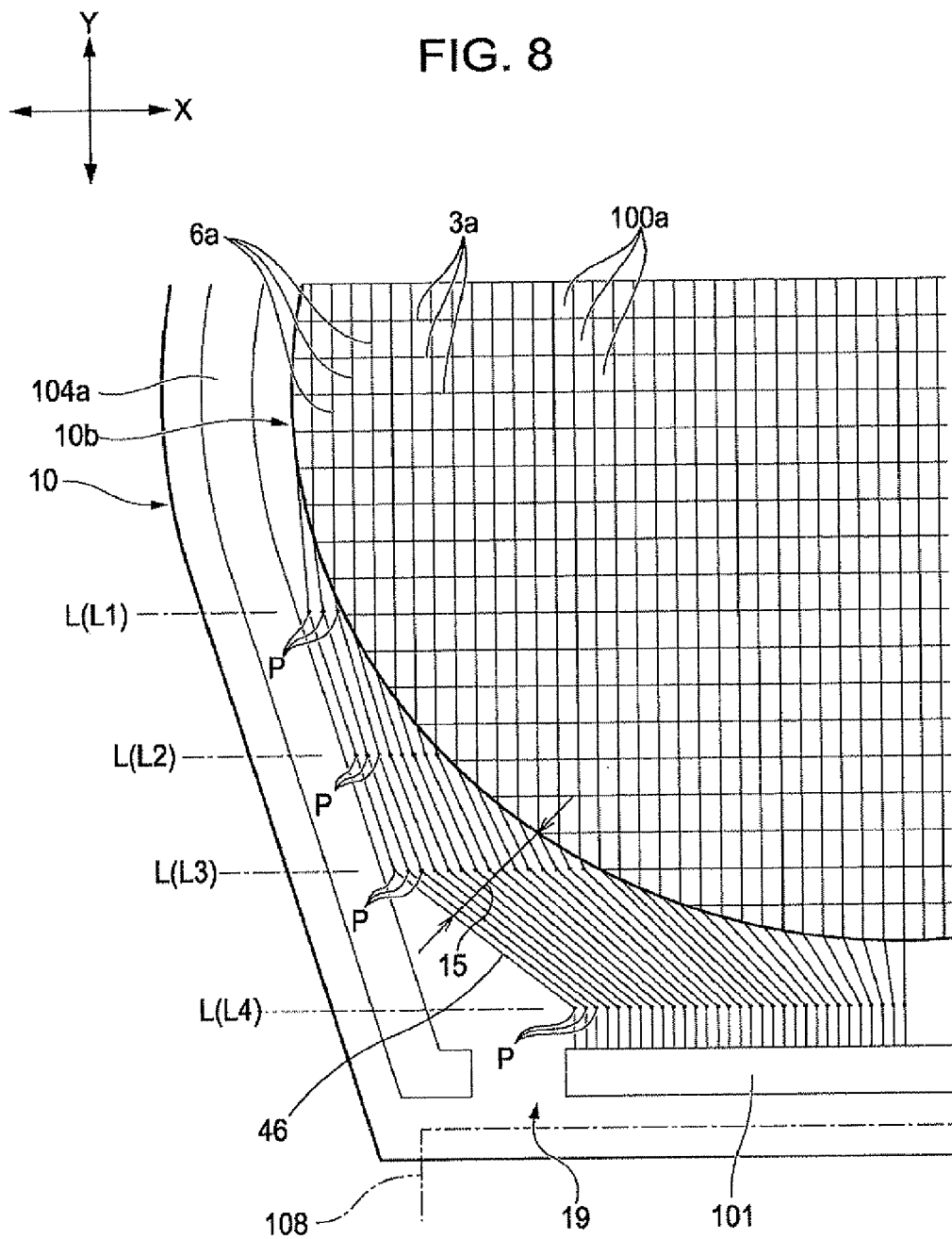
FIG. 8 is an enlarged schematic plan view of appearance of lead-out of data lines up to a data line driving circuit on a component substrate of an electro-optical device according to Embodiment 3 of the invention.
Figure 9:
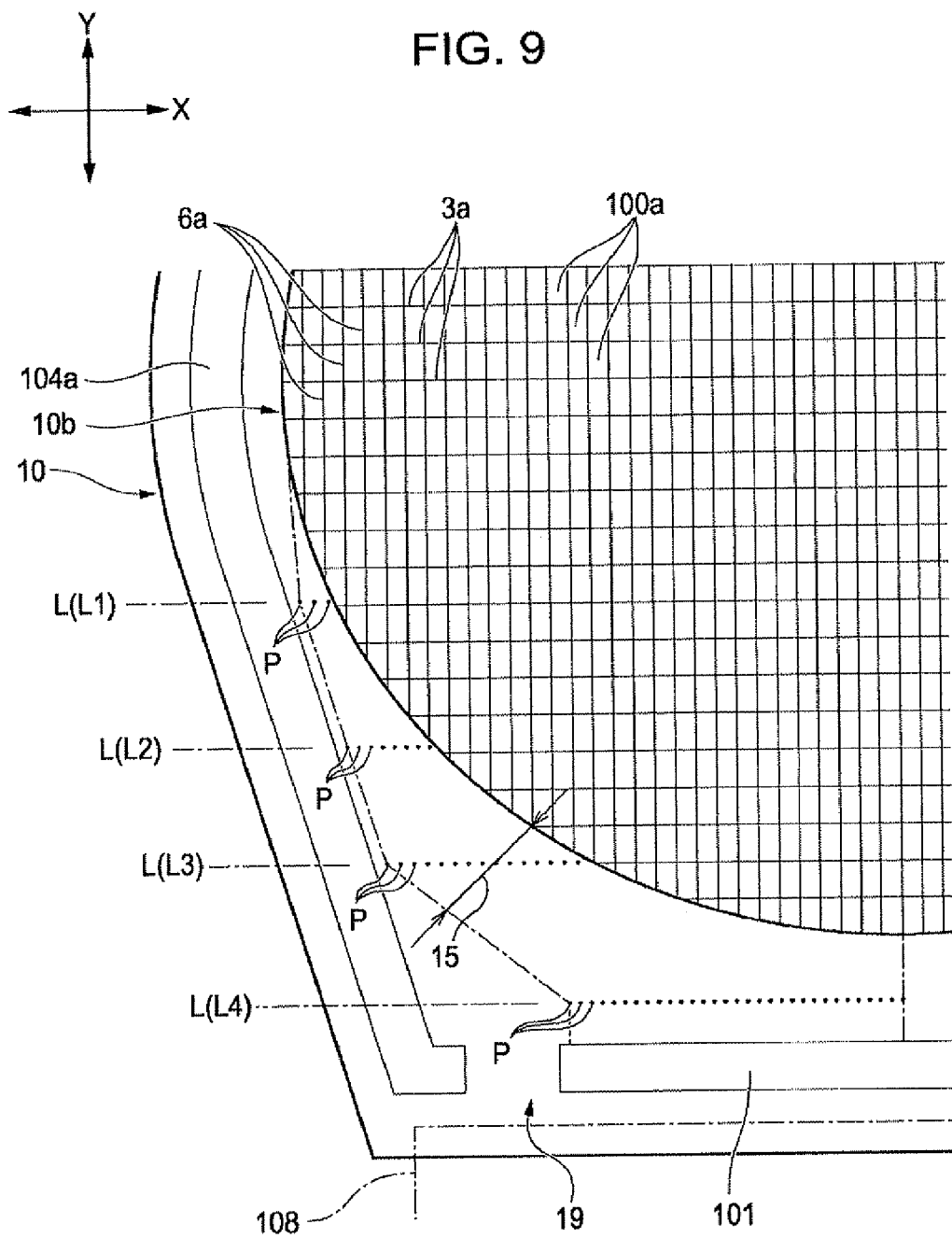
FIG. 9 is a diagram showing virtual reference lines and virtual reference points that are set for leading out data lines to the driving circuit in the electro-optical device according to Embodiment 3.

FIG. 8 is an enlarged schematic plan view of appearance of lead-out of the data lines 6a (the second signal lines) up to the data line driving circuit 101 (the signal output circuit, an area in which the signal output circuit is disposed) on the component substrate 10 of an electro-optical device 100 according to Embodiment 3 of the invention. FIG. 9 is a diagram showing virtual reference lines and virtual reference points that are set for leading out the data lines 6a to the driving circuit 101 in the electro-optical device 100 according to Embodiment 3. In FIGS. 8 and 9, the lead-out line of the scanning lines 3a (the first signal lines) of the pixel area 10b is not shown. In addition, although the outer peripheral edge line of the pixel area 10b has stepped parts along the pixel 100a, practically, the number of the pixels 100a is larger than that of the form shown in FIGS. 8 and 9, and the pixels are smaller than those shown in FIGS. 8 and 9. Thus, in FIGS. 8 and 9, the pixel area 10b is represented as a complete circle.

As shown in FIGS. 2A and 2B and FIGS. 3A and 3B, in the electro-optical device 100 according to this embodiment, the two-dimensional shape of the component substrate 10 is an irregular shape formed by combining semicircles and straight lines. In addition, in correspondence with the shape of the component substrate 10, the two-dimensional shape of the opposing substrate 20 has an irregular shape formed by combining semicircles and straight lines. In addition, the two-dimensional shape of the pixel area 10b is formed to be an oval shape having its vertical length slightly larger than its horizontal length, an elliptical shape (FIGS. 2A and 2B), or a perfect circular shape (FIGS. 3A and 3B). Accordingly, the pixel area 10b has irregular outer peripheral edge parts formed of curved portions in a portion facing the data line driving circuits 101.

The component substrate 10 includes a pull-out area 19 that is pulled out from one end part of the straight line shape of the opposing substrate 20 in the direction of extension of the data lines 6 in the pixel area 10b. In this pull-out area 19, the data line driving circuit 101 is disposed along the side part of the pull-out area. In addition, a flexible substrate 108 is connected to a pad 102 that is formed in an end part of the pull-out area 19. In addition, in an outside area of the pixel area 10b of the component substrate 10, the scanning line driving circuits 104a and 104b are disposed on a side located in the direction of extension of the scanning lines 3a. The scanning line driving circuits 104a and 104b are formed to extend along the outer peripheral edge of the component substrate 10, In the above-described electro-optical device 100, the scanning lines 3a are needed to be connected to the scanning line driving circuits 104a and 104b through the output lines 44, and the data lines 6a are needed to be connected to the data line driving circuit 101 though the output lines 46 (connection wirings) of the data lines 6a. Here, the output lines 46 of data lines 6a, which extend in both end parts of the pixel area 10b in direction X, of the data lines 6a are needed to be led out in a narrow and deep area, which is interposed between the outer peripheral edge of the component substrate 10 and the outer peripheral edge of the pixel area 10b, of the lead-out area 15 (an area in which the connection wiring is disposed) of the output lines 46. In addition, since the scanning line driving circuits 104a and 104b are formed along the outer peripheral edge of the component substrate 10, the output. lines 46 of the data lines 6a that extend in both end parts of the pixel area 10b in direction X are needed to be led out in a narrow area of the lead-out area which is interposed between the pixel area 10b and the scanning line driving circuits 104a and 104b, of the area interposed between the pixel area 10b and the outer peripheral edge of the component substrate 10.

Figure 16A:
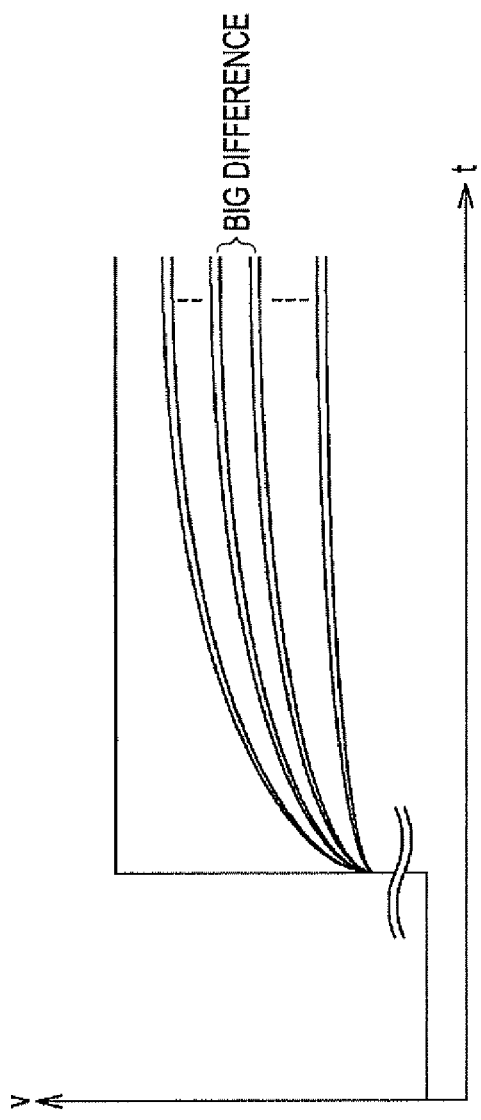
FIGS. 16A and 16B are a diagram showing a rate of rise of the voltage levels in a case where there is a big difference between adjacent data lines and a diagram showing a rate of rise of the voltage levels in a case where there is not a big difference between the adjacent data lines.

Here, the two-dimensional shape of the pixel area 10b is a circle. Thus, the width of the lead-out area 15 increases as the lead-out area 15 approaches the data line driving circuit 101 from both end parts of the pixel area 10b. However, the number of the output lines 46 that are connected to the data lines 6a drawn out from the pixel area 10b increases in that degree. In addition, when there is a big gap between adjacent output lines 46 in the lead-out area 15, as described with reference to FIG. 16A, a big difference of capacitance components that are parasite between the wirings is generated, and accordingly, a big difference of rates of rise of electric potentials in a case where a signal is applied is generated.

Thus, in this embodiment, as shown in FIGS. 2B, 3B, and 8, a plurality of virtual reference lines L that are located in positions separated in the direction of extension of the output lines 46 of the data lines 6a and cross the lead-out area 15 is set in the lead-out area 15 of the output lines 46 of the data lines 6a. In addition, a plurality of virtual reference points P that are set to be equally spaced is disposed on the plurality of the virtual reference lines L. The output lines 46 of the data lines 6a are led out, in the areas interposed between the virtual reference lines, so as to pass straight lines (virtual connection wirings Q (Q1, Q2, and Q3)) that connect the plurality of virtual reference points P and are bent at the virtual reference point P on the virtual reference line L to be led out to the data line driving circuit 101. Accordingly, in any area interposed between the virtual reference lines L, the output lines 46 of the data lines 6a can be led out with an approximate equal gap interposed therebetween.

The output lines 46 of the data lines 6a may be led out so as to follow the virtual connection wiring Q that connects the plurality of the virtual reference points P. In such a case, even in any area interposed between the virtual reference lines L, the output lines 46 of the data lines 6a can be led out to be approximately equally spaced. In addition, the virtual connection wiring Q may be configured as a line connected in a curve along the outer peripheral edge of the pixel area. In such a case, the output lines may be led out so as to pass or follow the virtual connection wiring Q. In such a case, in any area interposed between the virtual reference lines L, the output lines 46 of the data lines 6a can be led out to be approximately equally spaced.

The above-described virtual reference points P are not limited to be disposed with equally spaced, and may be set such that gaps gradually increases or decreases toward the outside of the component substrate 10. By slightly varying the gaps, the output lines 46 can be disposed in good balance in a narrow area that is curved or bent, and generation of a big difference of capacitance components that are parasite between the output lines 46 can be suppressed.

The above-described configuration will now be described with reference to FIG. 8. First, for the lead-out area 15 of the output lines 46 of the data lines 6a, a plurality of virtual reference lines L, for example, four virtual reference lines Li, L2, L3, and L4 are set in positions that are separated from one another in the direction of extension of the lead-out area 15 so as to cross the lead-out area 15. In this embodiment, the four virtual reference lines L (the virtual reference lines L1, L2, L3, and L4) are configured to be parallel to one another and perpendicular to the direction of extension of the data lines 6a of the pixel area 10b.

Next, in each one of the four virtual reference lines L, a plurality of the virtual reference points P corresponding to the number of the output lines 46 of the data lines 6a passing the virtual reference line is set. In such a case, in each one of the four virtual reference lines L, the virtual reference points P are set to be equally spaced. In particular, the virtual reference points P are set by dividing a part of the virtual reference line L located within the lead-out area 15 by the output lines 46 of the data lines 6a passing the part to be equally spaced apart from one another.

For example, in the example shown in FIG. 9, for a virtual reference line L1, which is departed farthest from the data line driving circuit 101, of the four virtual reference lines L, there are three output lines 46 of the data lines 6 that pass the virtual reference line L1, and accordingly, three virtual reference points P are set to be equally spaced. For a next virtual reference line L2, there are eight output lines 46 of the data lines 6 passing the virtual reference line L2, and accordingly, eight virtual reference points P are set to be equally spaced. In addition, for a next virtual reference line L3, there are 15 output lines 46 of the data lines 6 passing the virtual reference line L3, and accordingly, 15 virtual reference points P are set to be equally spaced. In addition, for a virtual reference line L4 that is located closest to the data line driving circuit 101, there are 31 output lines 46 of the data lines 6 passing the virtual reference line L4, and accordingly, 31 virtual reference points P are set to be equally spaced.

As shown in FIG. 8, after being drawn out from the pixel area 10b, the output lines 46 of the data lines 6a are led out to the data line driving circuit 101 along corresponding virtual reference points P. As a result, for each area interposed between the virtual reference lines L, the output lines 46 of the data lines 6a are led out in a straight line in the area interposed between the virtual reference lines L and are bent at the virtual reference lines L so as to be led out to the data line driving circuit 101. By configuring as described above, in any area interposed between the virtual reference lines L, the output lines 46 of all the data lines 6a are led out with approximately equally spaced.

Major Advantages of this Embodiment

Figure 16B:
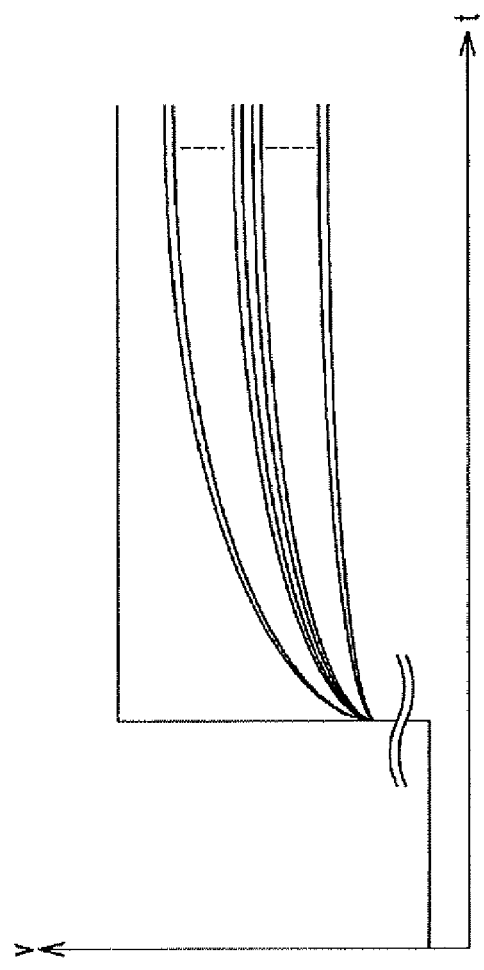

As described above, in the electro-optical device 100 according to this embodiment, even when there is restriction in the shape and width of the lead-out area 15 of the output lines 46 of the data lines 6a due to a non-rectangular shape of the pixel area or the like, there is no big difference between gaps of the output lines 46 of adjacent data lines. Accordingly, between the data lines 6a extends in the center of the pixel area 10b and the output lines 46 of the data lines 6a that connects the outer peripheral edge of the pixel area 10b and the data line driving circuit 101, there is no big difference between gaps of the adjacent output lines 46. Accordingly, a big difference between the capacitance components that are parasite in the lead-out parts of the output lines 46 of the adjacent data lines 6a is not generated. Therefore, as shown in FIG. 16B, there is no big difference in rates of rise of voltage levels. Accordingly, when an image is displayed in the pixel area 10b, differences in gray scale levels and luminance levels between the center of the pixel area and both sides of the pixel area 10b in a direction (direction X) perpendicular to the direction of extension of the data lines 6a are not generated. As a result, the quality of images becomes high.

Particularly, in this embodiment, the two-dimensional shape of the pixel area is a circle, and the output lines 46 of the data lines 6a, in a small-width deep area interposed between the pixel area 10b and the scanning line driving circuits 104a or 104b, are needed to be led out. However, even in such a case, by using the virtual reference lines L and the virtual reference points P, the output lines 46 of all the data lines 6a can be led out to be approximately equally spaced.

In addition, in this embodiment, although the output lines 46 of the data lines 6a extend in a straight line in each area interposed between the virtual reference lines L, the number of the virtual reference lines L is four. Thus, the output lines 46 of all the data lines 6a are appropriately distributed, and accordingly, appropriate gaps can be acquired between the output lines 46 of the adjacent data lines 6a. Here, the number of the virtual reference lines L is set as an optimal number based on the number of the output lines 46 of the data lines 6a and the curvature of the pixel area 10b. When the number of the virtual reference lines L is four or more, it is possible to appropriately respond to various conditions. In addition, when the number of the virtual reference lines L is eight, it is possible to respond to all the conditions on the whole.

Embodiment 4

Figure 10:
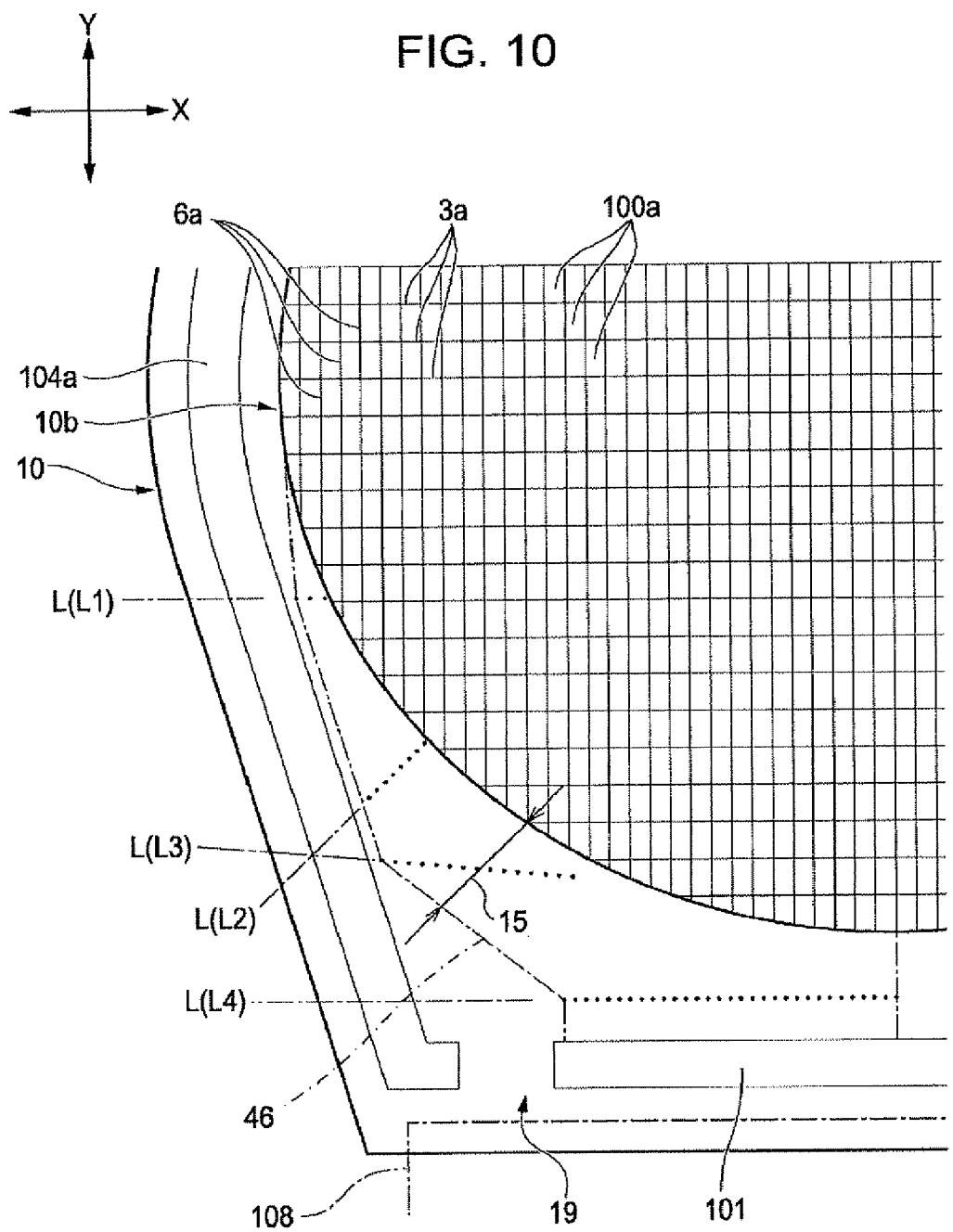
FIG. 10 is a diagram showing virtual reference lines and virtual reference points that are set for leading out data lines to a data line driving circuit in an electro-optical device according to Embodiment 4 of the invention.

FIG. 10 is a diagram showing virtual reference lines and virtual reference points that are set for leading out output lines 46 of data lines 6a to a data line driving circuit 101 in an electro-optical device 100 according to Embodiment 4 of the invention. The basic configuration of the electro-optical device 100 according to this embodiment is the same as that according to Embodiment 3, and thus, to each common part, a same reference sign is assigned, and a description thereof is omitted here.

In Embodiment 3, the plurality of the virtual reference lines L are set to be parallel to one another, and the virtual reference lines L are set in the direction perpendicular to extension of the data lines 6a of the pixel area 10b. However, as shown in FIG. 7, a configuration in which the virtual reference lines L are not parallel to one another may be used. In such a case, a configuration in which all the virtual reference lines L are not parallel to one another or a configuration in which, among a plurality of the virtual reference lines L, some reference lines L are parallel to one another and the other reference lines L are not parallel to one another may be used. Alternatively, a configuration in which all the virtual reference lines L are parallel to one another and the virtual reference lines L are set in the direction for intersecting the direction of extension of the data lines 6a of the pixel area 10b may be used.

Modified Examples of Embodiments 3 and 4

In the above-described Embodiments 3 and 4, the driving IC that is mounted on the component substrate 10 is disposed in the area in which the signal output circuit for the data lines 6a are disposed, as the data line driving circuit 101. However, the invention is not limited thereto. Thus, the data line driving circuit 101 may be configured by using a thin film transistor that is formed on the component substrate 10 by using the SOG technology. In such a case, the number of components decreases so as to be able to reduce the costs, and an electro-optical device having a higher value for industrial use can be implemented. In a case where the data line driving circuits 104a and 104h are not configured on the component substrate 10 and signals for the data lines 6a are output from an external circuit through a flexible substrate that is connected to the component substrate 10, a connection area (for example, a pad 102) of the flexible substrate serves as an area in which the signal output circuit for the data lines 6a is disposed. The invention may be applied to the electro-optical device configured as above.

In addition, in the above-described Embodiments 3 and 4, a poly-silicon film is used as the semiconductor layer 1a of the thin film transistor 30a. However, the invention may be applied to an electro-optical device 100 in which a single crystal silicon layer or an amorphous silicon film is used as the semiconductor layer 1a of the thin film transistor 30a. In addition, in the above-described embodiments, the data lines 6a have been described as the second signal lines and the scanning lines 3a have been described as the first signal lines. However, the invention may be applied to an electro-optical device in which the scanning lines 3a are configured as the second signal lines and the data lines 6a are configured as the first signal lines.

In addition, in the above-described Embodiments 3 and 4, after being drawn out from the pixel area 10b, the output lines 46 of the data lines 6a are led out to the data line driving circuit 101 along corresponding virtual reference points P. In that case, for each area interposed between the virtual reference lines L, the output lines 46 of the data lines 6a are led out in straight lines in the area interposed between the virtual reference lines L and are bent at the virtual reference lines L so as to be led out to the data line driving circuit 101. However, the invention is not limited thereto. Thus, a configuration in which the output lines are led out in curves along the outer peripheral edge of the pixel area in the area interposed between the virtual reference lines L and are gently bent at the virtual reference lines L so as to be led out to have approximately same gaps between the output lines 46 of all the data lines 6a in any area interposed between the virtual reference lines L may be used.

Embodiment 5

Hereinafter, an example in which the invention is applied to an organic EL device will be described. In descriptions below, to each corresponding parts, a same reference sign is assigned for descriptions, so that parts of this embodiment corresponding to those of Embodiments 1, 2, 3, and 4 can be easily known.

Overall Configuration

Figure 11:
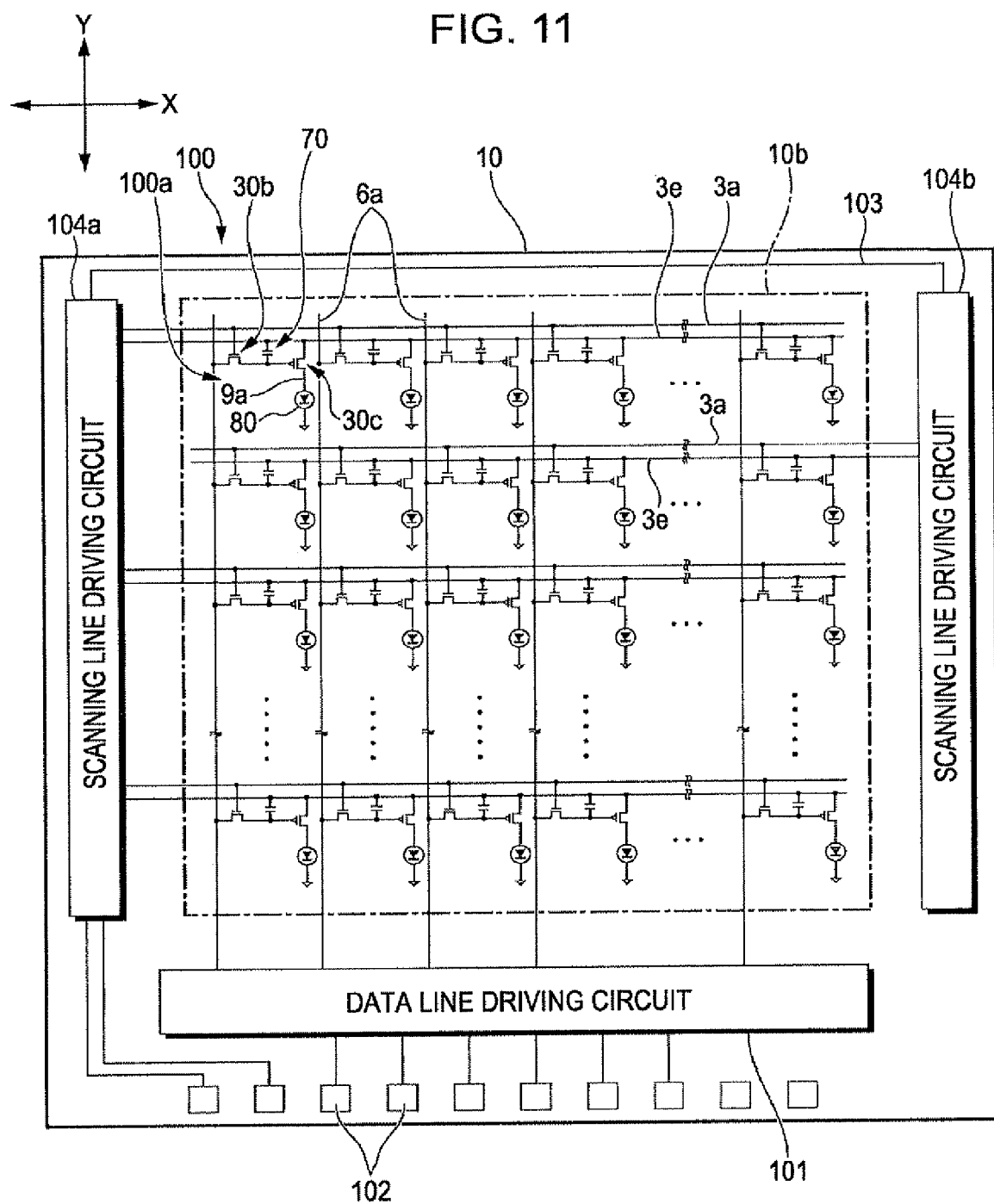
FIG. 11 is a block diagram showing the electrical configuration of an electro-optical device (organic EL device) according to Embodiment 5 of the invention.
Figure 12A:
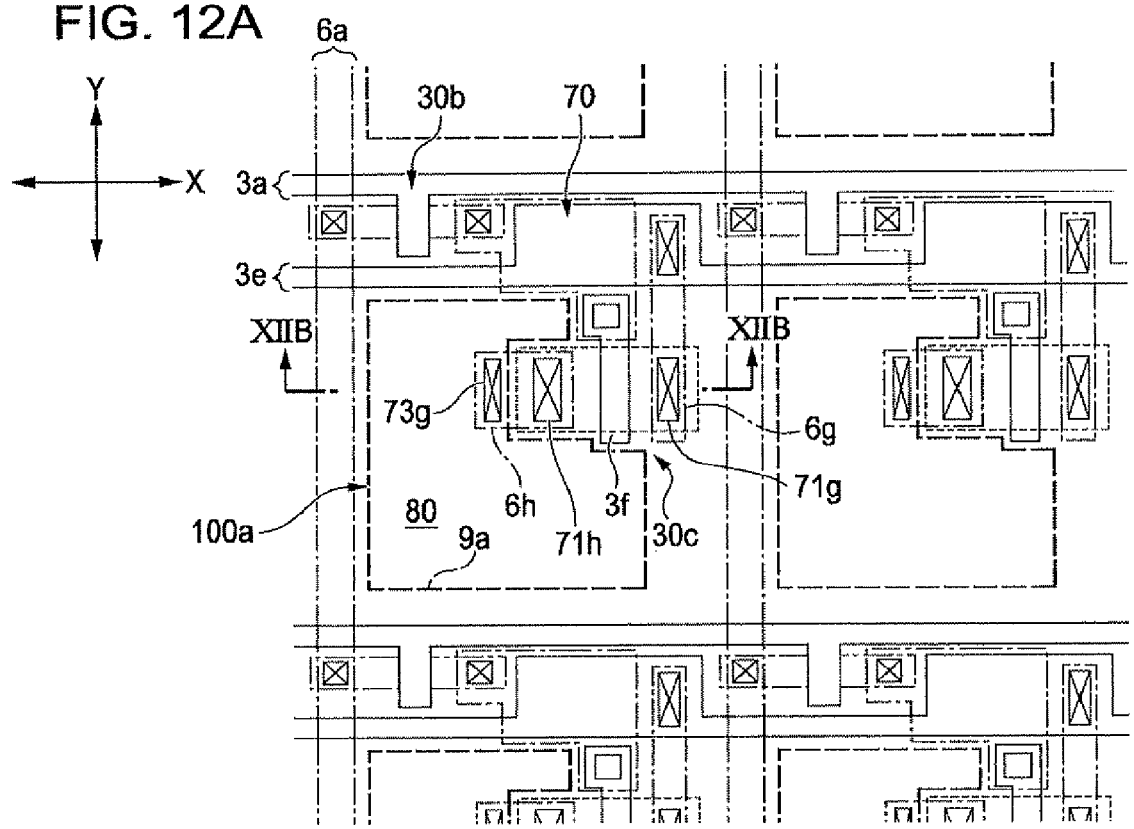
FIGS. 12A and 12B are a plan view of two adjacent pixels of the electro-optical device according to Embodiment 5 and a cross-section view of one pixel thereof.
Figure 12B:
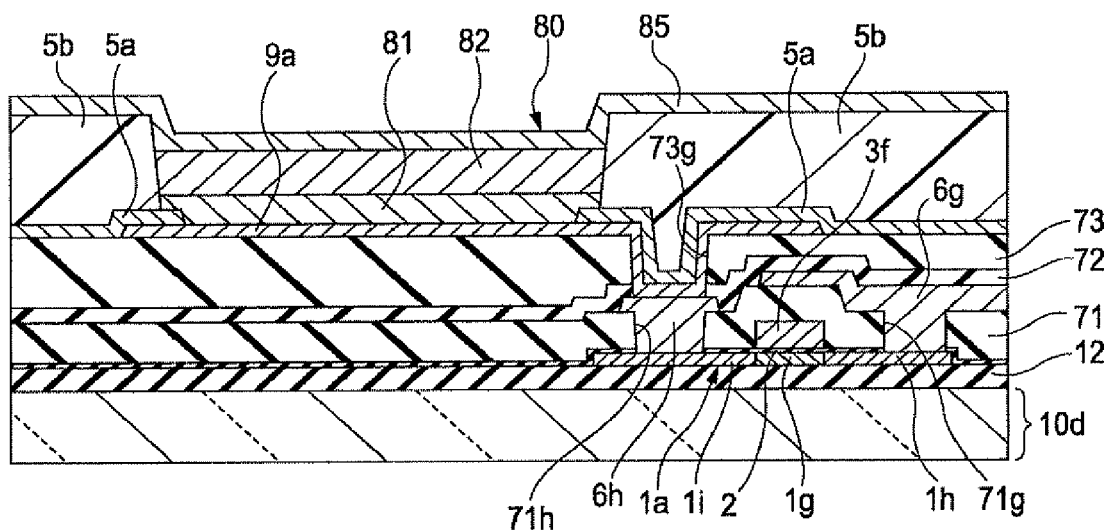

FIG. 11 is a block diagram showing the electrical configuration of an electro-optical device (organic EL device) according to Embodiment 5 of the invention. FIGS. 12A and 12B are a plan view of two adjacent pixels of the electro-optical device 100 according to Embodiment 5 and a cross-section view of one pixel thereof. FIG. 12B is a cross-section view taken along line XIIB-XIIB shown in FIG. 12A. In FIG. 12A, a pixel electrode 9a is denoted by a long dotted line, a data line 6a and a thin film formed simultaneously with the data line 61 are denoted by a dashed dotted line, a scanning line 3a is denoted by a solid line, and a semiconductor layer is denoted by a short dotted line.

The electro-optical device 100 shown in FIG. 11 is an organic EL device. On a component substrate 10, a plurality of scanning lines 3a (first signal lines), a plurality of data lines 6a (second signal lines) extending in the direction for intersecting the scanning lines 3a, and a plurality of power lines 3e extending in parallel with the scanning lines 3a are formed. In addition, a plurality of pixels 100a are arranged in a matrix shape in a pixel area 10b of the component substrate 10. To the data lines 6a, a data line driving circuit 101 (signal output circuit) is connected, and to the scanning lines 3a, scanning line driving circuits 104a and 104b (signal output circuits) are connected. In each pixel area 10b, a switching thin film transistor 30b having a gate electrode to which a scanning signal is supplied through the scanning line 3a, a holding capacitor 70 that maintains a pixel signal supplied from the data line 6a through the switching thin film transistor 30b, a driving thin film transistor 30c having a gate electrode to which the pixel signal maintained by the holding capacitor 70 is supplied, a pixel electrode 9a (anode layer) in which a driving current flows from the power line 3e in a case where the pixel electrode is electrically connected to the power line 3e through the thin film transistor 30c, and an organic EL element 80 having an organic function layer interposed between the pixel electrode 9a and a cathode layer are configured.

Under such a configuration, when the scanning line 3a is driven so as to turn on the switching thin film transistor 30b, the electric potential of the data line 6a at that moment is maintained in the holding capacitor 70. Depending on charges maintained by the holding capacitor 70, the on/off state of the driving thin film transistor 30c is determined. Then, a current flows from the power line 3e to the pixel electrode 9a through a channel of the driving thin film transistor 30c, and then a current flows in an opposite-polarity layer though the organic function layer. As a result, the organic EL element 80 emits light in accordance with the amount of the current flowing through it.

In the configuration shown in FIG. 11, the power lines 3e are connected in parallel with the scanning lines 3a. However, a configuration in which the power lines 3e are connected in parallel with the data lines 6a may be used. In addition, in the configuration shown in FIG. 11, the holding capacitor 70 is configured by using the power line 3e. However, it may be configured that a capacitor line other than the power line 3e is additionally formed and the holding capacitor 70 is configured by using the capacitor line.

As shown in FIGS. 12A and 12S, on the component substrate 10, a plurality of transparent pixel electrodes 9a (areas surrounded by long dotted lines) having a matrix shape is formed for each pixel 100a, and the data lines 6a (areas denoted by dashed dotted lines) and the scanning lines 3a (areas denoted by solid lines) that extend along horizontal and vertical boundary areas of the pixel electrode 9a are formed. In addition, on the component substrate 10, the power line 3e is formed in parallel with the scanning line 3a.

A base body of the component substrate 10 shown in FIG. 12S is formed of a support substrate 10d such as a quartz substrate or a heat-resistant glass substrate. In the component substrate 10, a bottom insulating layer 12 formed of a silicon dioxide film or the like is formed on the surface of the support substrate 10d. In addition, on the surface side of the bottom insulating layer 12, a thin film transistor 30c is formed in an area corresponding to the pixel electrode 9a. In the thin film transistor 30c, a channel region 1g, a source region 1h, and a drain region 1i are formed with respect to a semiconductor layer 1a having an island shape. On the surface side of the semiconductor layer 1a, a gate insulating layer 2 is formed, and on the surface of the gate insulating layer 2, a gate electrode 3f is formed. The gate electrode 3f is electrically connected to the drain of the thin film transistor Since the basic configuration of the thin film transistor 30b is the same as that of the thin film transistor 30c, a description thereof is omitted here.

On the upper layer side of the thin film transistor 30c, an interlayer insulating layer 71 formed of a silicon dioxide film or a silicon nitride film, an interlayer insulating layer 72 formed of a silicon dioxide film or a silicon nitride film, and an interlayer insulating film 73 (planarizing film) formed of a thick photosensitive resin having a thickness of 1.5 to 2.5 pm are formed. On the surface of the interlayer insulating layer 71 (between the interlayer insulating films 71 and 72), a source electrode 6g and a drain electrode 6h are formed. In addition, the source electrode 6g is electrically connected to the source region 1h through a contact hole 71g that is formed in the interlayer insulating layer 71. In addition, the drain electrode 6h is electrically connected to the drain region 1i through a contact hole 71h formed in the interlayer insulating layer 71. On the surface of the interlayer insulating layer 73, the pixel electrode 9a formed of an ITO film is formed. The pixel electrode 9a is electrically connected to the drain electrode 6h through a contact hole 73g formed in the interlayer insulating layers 72 and 73.

In addition, in an upper layer of the pixel electrode 9a, a partition wall 5a that has an opening part for defining a light emitting area and is formed of silicon dioxide or the like and a thick partition wall 5b formed of a photosensitive resin or the like are formed. Within an area surrounded by the partition walls 5a and 5b, in the upper layer of the pixel electrode 9a, an organic function layer formed of a hole injecting layer 81 that is formed of 3, 4-polyethylene dioxythiophene/polystyrene sulfonate (PEDOT/PSS) or the like and a light emitting layer 82 is formed. In addition, in the upper layer of the light emitting layer 82, a cathode layer 85 is formed. As described above, the organic EL element is configured by the pixel electrode 9a, the hole injecting layer 81, the light emitting layer 82, and the cathode layer 85. The light emitting layer 82 is, for example, formed of a material that is acquired by doping perylene-based dye, coumalin-based dye, or rhodamine-based dye, for example, Rubrene, perylene, 9, 10-diphenylantracene, tetra phenyl butadiene, Nile red, coumalin 6, or quinacridone into, for example, a polyfluorene derivative, a polypenylene derivative, polyvinylcarbazole, a polythiophene derivative, or a polymer material thereof. As the light emitting layer 82, a polymer material of a IT-conjugated system in which double bonded H' electrons are non-polarized on a polymer chain that is a conductive polymer has a superior light emitting capability, and accordingly is used appropriately. In particular, a compound having a fluorene skeleton in its molecular, which is a polyfluorene-based compound, can be appropriately used. Other than the above-described materials, a composition containing a precursor of a polymer organic compound of a conjugated system and at least one type of fluorescent dye for changing the light emitting characteristic can be used. In this embodiment, the organic function layer is formed by a coating method such as an ink jet method. As the coating method, a flexo printing method, a spin-coat method, a slit-coat method, or a dye-coat method may be used. In addition, the organic function layer may be formed by using a vapor-deposition method. In addition, between the light emitting layer 82 and the cathode layer 85, an electron injecting layer formed of LiF or the like may be formed.

Since an organic EL device of the top emission type outputs light from a side on which the organic EL element 80 is formed relative to the support substrate 10d, the cathode layer 85 is formed of a thin aluminum film or a translucent electrode such as an ITO film of which work function is adjusted by attaching a thin film formed of magnesium or lithium. As the support substrate 10d, an opaque substrate other than a transparent substrate such as glass may be used. As the opaque substrate, for example, ceramics such as alumina, a substrate acquired from performing an insulation process such as surface oxidation for a metal plate such as stainless steel, or a resin substrate may be used. On the other hand, for an organic EL device of the bottom emission type, light is output from the support substrate 10d side, and thus, a transparent substrate such as glass is used as the support substrate 10d.

In the above-described electro-optical device 100, similarly to the electro-optical device of Embodiment 1 or 2, when parts of the pixel area 10b facing the scanning line driving circuits 104a and 104b are formed of curved portions, the configuration described with reference to FIGS. 5 to 7 is used for configuring the scanning line driving circuits 104a and 104b.

Another Embodiment

FIGS. 13A, 13B, and 13C and FIGS. 14A, 14B, and 14C are diagrams showing the two-dimensional shape of a pixel area 10b and a component substrate 10 of an electro-optical device according to another embodiment of the invention.

In the above-described embodiments, the two-dimensional shape of the component substrate 10 has an irregular shape acquired by combining arcs and straight lines, and the two-dimensional shape of the pixel area 10b is configured as a circle. However, the invention may be applied to a case where the pixel area 10b has an irregular outer peripheral edge part formed of a curved portion or a bent portion in portions facing the scanning line driving circuits 104a and 104b, other than the above-described shape. In other words, the invention may be applied to a case where the pixel area 10b has an irregular shape such as a circle, triangle, polygon having five vertexes or more, or a shape acquired from combining curves and straight lines and has irregular outer peripheral portions formed of curved portions or bent portions in parts facing the scanning line driving circuits 104a and 104b. In addition, the invention may be applied to a case where the component substrate 10 has an irregular shape of a circle, triangle, polygon having five vertexes or more, or a shape acquired from combining curves and straight lines.

Figure 13A:
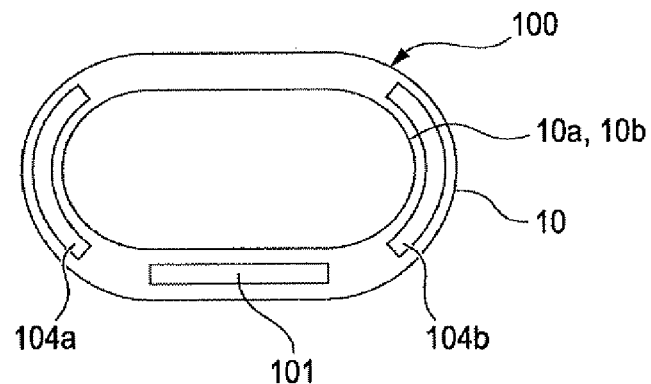
FIGS. 13A, 13B, and 13C are diagrams showing the two-dimensional shape of a pixel area and a component substrate of an electro-optical device according to another embodiment of the invention.
Figure 13B:
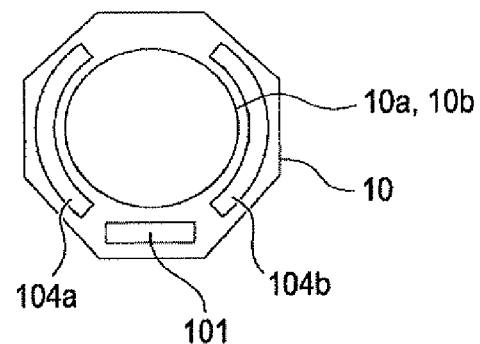
Figure 13C:
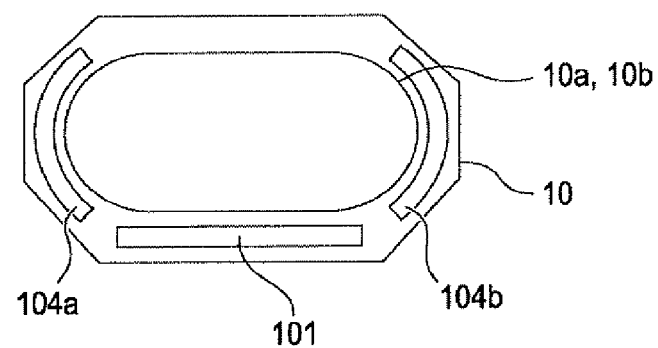

For example, the invention may be applied to an electro-optical device 100, as shown in FIG. 13A, having an oval shape in which the two dimensional shapes of the component substrate 10 and the pixel area 10b extend in a same direction, an electro-optical device 100, as shown in FIG. 13B, in which the two-dimensional shape of the component substrate 10 is an octagon and the two-dimensional shape of the pixel area 10b is a complete circle, and an electro-optical device 100, as shown in FIG. 13C, in which the two-dimensional shape of the component substrate 10 is an octagon enlarged horizontally and the two-dimensional shape of the pixel area 10b is an oval having a horizontal major axis.

Figure 14A:
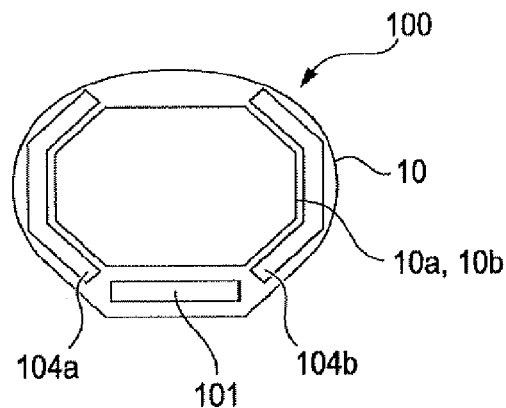
FIGS. 14A, 14B, and 14C are diagrams showing the two-dimensional shape of a pixel area and a component substrate of an electro-optical device according to another embodiment of the invention.
Figure 14B:
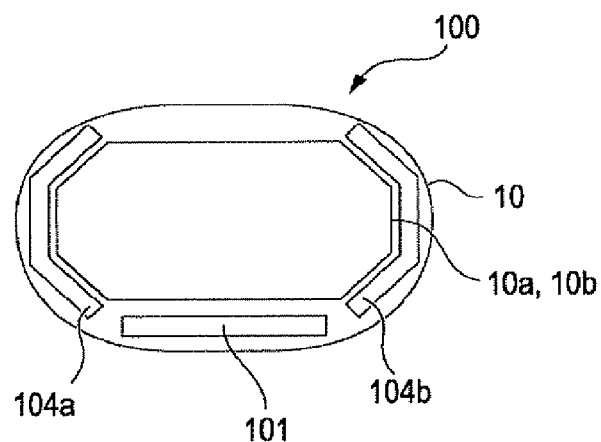
Figure 14C:
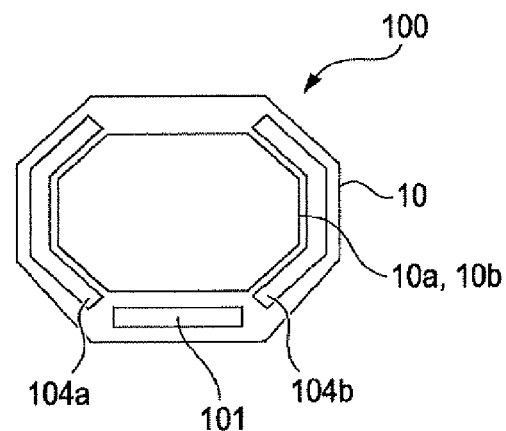
Figure 15A:
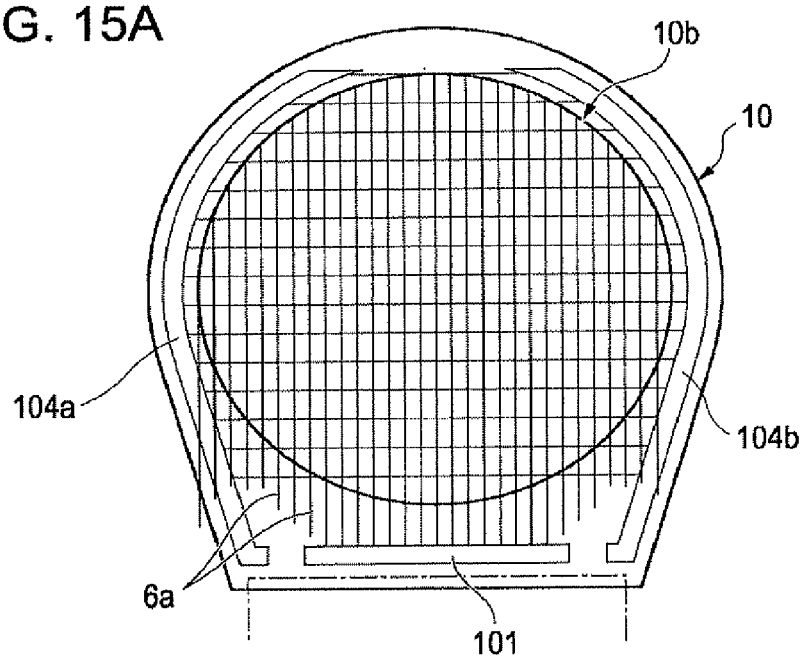
FIGS. 15A and 15B are diagrams showing the two-dimensional shape of a pixel area and a component substrate that are used in an electro-optical device according to a reference example.
Figure 15B:
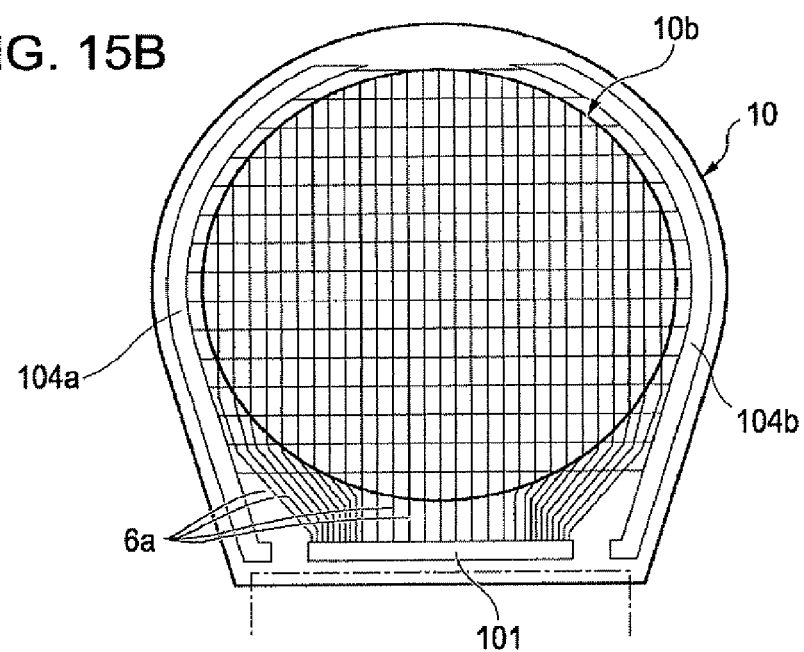

In addition, the invention may be applied to an electro-optical device 100, as shown in FIG. 14A, in which the component substrate 10 has an irregular shape acquired from combining semicircles and straight lines and the pixel area 10b has an octagon shape, an electro-optical device 100, as shown in FIG. 14B, in which the component substrate 10 is an oval shape having a horizontal major axis and the pixel area 10b is an octagon enlarged horizontally, and an electro-optical device 100, as shown in FIG. 14C, in which both the shapes of the component substrate 10 and the pixel area 10b are octagons.

In addition, the invention may be applied to a case where the component substrate 10 and/or the pixel area 10b are rectangles, as long as a configuration in which both the component substrate 10 and the pixel area 10b have bent portions in portions facing the scanning line driving circuits 104a and 104b is used.

Another Embodiment

In the above-described embodiments, as the data line driving circuit 101 that is disposed in the signal output area for the data lines 6a, the driving IC that is mounted on the component substrate 10 is disposed. However, the invention is not limited thereto. Thus, the invention may be applied to an electro-optical device in which the data line driving circuit 101 is configured by using a thin film transistor formed on the component substrate 10. In addition, the invention may be applied to an electro-optical device in which the data line driving circuit 101 is not configured on the component substrate 10 and signals for the data lines 6a are output from an external circuit though a flexible substrate connected to the component substrate 10. In such a case, an area (connection area) in which a connection terminal for the flexible substrate or the like is disposed serves as an area in which the signal output circuit for the data lines 6a is disposed. The invention may be applied to the electro-optical device configured as described above, In the above-described embodiments, an example in which the scanning line driving circuits 104a and 104b are configured on both sides of the pixel area 10b has been described. However, the invention may be applied to an electro-optical device in which the scanning line driving circuits 104a and 104b are configured only on one side of the pixel area 10b.

In addition, in the above-described embodiments, the invention is applied for configuring the scanning line driving circuits 104a and 104b. However, the invention may be applied for configuring the data line driving circuit 101. In other words, in the above-described embodiments, the scanning lines 3a have been described as the first signal lines, and the data lines 6a have been described as the second signal lines. However, the invention may be applied to an electro-optical device in which the scanning lines 3a are configured as the second signal lines and the data lines 6a are configured as the first signal lines.

In addition, in the above-described Embodiment 1, a poly-silicon film is used as the semiconductor layer 1a of the thin film transistor 30a. However, the invention may be applied to an electro-optical device 100 in which a single-crystal silicon layer or an amorphous silicon film is used as the semiconductor layer 1a of the thin film transistor 30a.

The entire disclosure of Japanese Patent Application Nos: 2007-274733, filed Oct. 23, 2007 and 2008-164115, filed Jun. 24, 2008 are expressly incorporated by reference herein.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. An electro-optical device comprising:
a substrate;
gate lines extending in a first direction on the substrate;
a pixel area in which pixel electrodes are disposed;
an outer peripheral edge of the pixel area having a curved portion or a bent portion;
a first circuit block and a second circuit block which are arranged along the curved portion or the bent portion of the outer peripheral edge;
a first gate line included in the gate lines and connected to the first circuit block via a first relay line and a first output line, the first output line extending from the first circuit block, the first relay line connecting an end of the first gate line with an end of the first output line; and
a second gate line included in the gate lines and connected to the second circuit block via a second relay line and a second output line, the second output line extending from the second circuit block, the second relay line connecting an end of the second gate line with an end of the second output line,
wherein a second direction from the end of the first output line to the end of the first gate line is opposite to a third direction from the end of the second output line to the end of the second gate line,
wherein the second direction is orthogonal to the first direction,
wherein the third direction is orthogonal to the first direction.

2. The electro-optical device according to claim 1, wherein
the first relay line extends in the second direction, and
the second relay line extends in the third direction.

3. The electro-optical device according to claim 1, wherein
the first relay line extends from the end of the first output line toward the second circuit block, and
the second relay line extends from the end of the second output line toward the first circuit block.

4. The electro-optical device according to claim 1, wherein
the first relay line extends from the end of the first output line toward an opposite side of the second circuit block, and
the second relay line extends from the end of the second output line toward an opposite side of the first circuit block.

5. The electro-optical device according to claim 1, wherein
first output lines including the first output line extend from the first circuit block,
second output lines including the second output line extend from the second circuit block,
of the first output lines, the first output line is closest to the second circuit block, and
of the second output lines, the second output line is closest to the first circuit block.

6. The electro-optical device according to claim 1, wherein
first output lines including the first output line extend from the first circuit block,
second output lines including the second output line extend from the second circuit block,
of the first output lines, the first output line is farthest from the second circuit block, and
of the second output lines, the second output line is farthest from the first circuit block.

7. The electro-optical device according to claim 1, wherein a length of the first relay line is different from a length of the second relay line.

8. The electro-optical device according to claim 1, further comprising
a third gate line included in the gate lines and connected to the first circuit block via a third relay line and a third output line; and
a fourth gate line included in the gate lines and connected to the second circuit block via a fourth relay line and a fourth output line, wherein
a fourth direction from an end of the third output line to an end of the third gate line is opposite to a fifth direction from an end of the fourth output line to an end of the fourth gate line.

9. The electro-optical device according to claim 8, wherein the fourth direction is a same as the second direction.

10. The electro-optical device according to claim 8, wherein the fifth direction is a same as the third direction.

11. The electro-optical device according to claim 8, wherein
the first circuit bock includes a first unit circuit and a second unit circuit, and
the first output line and the third output line are connected to the first unit circuit and the second unit circuit respectively.

12. The electro-optical device according to claim 11, wherein
the first unit circuit includes a first shift register, and
the second unit circuit includes a second shift register.

13. An electro-optical device comprising:
a substrate;
gate lines extending in a first direction on the substrate;
a pixel area in which pixel electrodes are disposed, the pixel area having a curved portion or a bent portion;
a first circuit block and a second circuit block that are arranged outside the pixel area and along the curved portion or the bent portion of the pixel area;
a first gate line included in the gate lines and connected to the first circuit block via a first relay line and a first output line, the first output line extending from the first circuit block, the first relay line connecting a point of the first gate line with a point of the first output line; and
a second gate line included in the gate lines and connected to the second circuit block via a second relay line and a second output line, the second output line extending from the second circuit block, the second relay line connecting a point of the second gate line with a point of the second t output line;
wherein a second direction from the point of the first output line to the point of the first gate line is opposite to a third direction from the point of the second output line to the point of the second gate line,
wherein the second direction is orthogonal to the first direction,
wherein the third direction is orthogonal to the first direction.

14. The electro-optical device according to claim 13, wherein
the pixel electrodes has first pixel electrodes lined up in the first direction, second pixel electrodes lined up in the first direction, and the third pixel electrodes lined up in the first direction,
a first unit of the first pixel electrodes, a second unit of the second pixel electrodes, and a third unit of the third pixel electrodes are arranged in a direction intersecting the first direction in this order,
the number of the first pixel electrodes is greater than the number of the second pixel electrodes, and
the number of the second pixel electrodes is greater than the number of the third pixel electrodes.

15. The electro-optical device according to claim 13, wherein
the pixel electrodes has first pixel electrodes lined up in the first direction, second pixel electrodes lined up in the first direction, and the third pixel electrodes lined up in the first direction,
a first unit of the first pixel electrodes, a second unit of the second pixel electrodes, and a third unit of the third pixel electrodes are arranged in a direction intersecting the first direction, in the order as listed,
a length of the first unit is longer than a length of the second unit, and
the length of the second unit is longer than a length of the third unit.

16. The electro-optical device according to claim 13, wherein
the first relay line extends in the second direction, and
the second relay line extends in the third direction.

17. The electro-optical device according to claim 13, wherein
the first relay line extends from the point of the first output line toward the second circuit block, and
the second relay line extends from the point of the second output line toward the first circuit block.

18. The electro-optical device according to claim 13, wherein
the first relay line extends from the point of the first output line toward an opposite side of the second circuit block, and
the second relay line extends from the point of the second output line toward an opposite side of the first circuit block.

19. The electro-optical device according to claim 13, wherein
first output lines including the first output line extend from the first circuit block,
second output lines including the second output line extend from the second circuit block,
of the first output lines, the first output line is closest to the second circuit block, and
of the second output lines, the second output line is closest to the first circuit block.

20. The electro-optical device according to claim 13, wherein
first output lines including the first output line extend from the first circuit block,
second output lines including the second output line extend from the second circuit block,
of the first output lines, the first output line is farthest from the second circuit block, and
of the second output lines, the second output line is farthest from the first circuit block.

* * * * *